(12) United States Patent
Sun et al.

(10) Patent No.: US 12,408,310 B2
(45) Date of Patent: Sep. 2, 2025

(54) POWER CONVERTER, HEAT EXCHANGER, HEAT SINK, AND PHOTOVOLTAIC POWER GENERATION SYSTEM

(71) Applicant: Huawei Digital Power Technologies Co., Ltd., Shenzhen (CN)

(72) Inventors: Faming Sun, Dongguan (CN); Jun Chen, Dongguan (CN); Quanming Li, Dongguan (CN); Xiaowei Hui, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 218 days.

(21) Appl. No.: 18/336,209

(22) Filed: Jun. 16, 2023

(65) Prior Publication Data

US 2023/0328936 A1  Oct. 12, 2023

Related U.S. Application Data

(63) Continuation of application No. PCT/CN2020/138161, filed on Dec. 22, 2020.

(51) Int. Cl.
*H05K 7/20* (2006.01)
*H01L 23/367* (2006.01)
(Continued)

(52) U.S. Cl.
CPC ........... *H05K 7/209* (2013.01); *H01L 23/367* (2013.01); *H02M 1/327* (2021.05); *H02S 40/32* (2014.12);
(Continued)

(58) Field of Classification Search
CPC ........... H05K 7/20254; H05K 7/20263; H05K 7/209; H05K 7/20936; H05K 2201/064;
(Continued)

(56) References Cited

U.S. PATENT DOCUMENTS

2005/0092461 A1* 5/2005 Kroetsch ............... F28F 9/0202
165/149
2009/0120610 A1* 5/2009 Coyle ................ B60H 1/00321
165/67
(Continued)

FOREIGN PATENT DOCUMENTS

CN        202147075 U    2/2012
CN        204168153 U    2/2015
(Continued)

OTHER PUBLICATIONS

EP-2879475-A1 English Translation (Year: 2015).*

*Primary Examiner* — Amir A Jalali
(74) *Attorney, Agent, or Firm* — Maier & Maier, PLLC

(57) ABSTRACT

A power converter, heat exchangers, heat sinks, and a photovoltaic power generation system, related to the field of heat dissipation. The power converter includes: a power semiconductor device, a magnetic element, a sealed cavity, and a heat dissipation cavity. The power semiconductor device and the magnetic element are disposed in the sealed cavity. The power semiconductor device dissipates heat through a first heat sink, and cooling fins of the first heat sink are located in the heat dissipation cavity. The magnetic element dissipates heat through a second heat sink, and cooling fins of the second heat sink are located in the heat dissipation cavity, Accordingly, reliability and heat dissipation effect of heat dissipation performed by the power converter are improved.

17 Claims, 16 Drawing Sheets

(51) Int. Cl.
*H02M 1/32* (2007.01)
*H02S 40/32* (2014.01)
*H02S 40/42* (2014.01)

(52) U.S. Cl.
CPC ......... *H02S 40/42* (2014.12); *H05K 7/20936* (2013.01)

(58) Field of Classification Search
CPC ....... H05K 1/0203; H02S 40/32; H02S 40/42; H02M 1/327; H01L 23/367
See application file for complete search history.

(56) References Cited

U.S. PATENT DOCUMENTS

| | | | | |
|---|---|---|---|---|
| 2012/0250254 A1* | 10/2012 | Kojyo | ................ | H05K 7/20918 361/692 |
| 2013/0343110 A1* | 12/2013 | Liu | ................... | H05K 7/20909 363/141 |
| 2015/0159961 A1* | 6/2015 | Berndt | ............... | B60H 1/00521 165/173 |
| 2016/0128236 A1* | 5/2016 | Pietrantonio | ...... | H05K 7/20509 361/702 |
| 2016/0302330 A1* | 10/2016 | Hamari | .................. | H05K 7/209 |
| 2017/0188488 A1 | 6/2017 | Takezawa et al. | | |

FOREIGN PATENT DOCUMENTS

| | | | | |
|---|---|---|---|---|
| CN | 204350525 U | 5/2015 | | |
| CN | 107171570 A | 9/2017 | | |
| CN | 207368891 U | 5/2018 | | |
| CN | 109361240 A | 2/2019 | | |
| CN | 208971402 U | 6/2019 | | |
| CN | 209627906 U | 11/2019 | | |
| CN | 111895521 A | 11/2020 | | |
| EP | 2651022 A1 | 10/2013 | | |
| EP | 2879475 A1 * | 6/2015 | ........... | H05K 7/1432 |
| EP | 3079451 A1 | 10/2016 | | |
| JP | 2014078582 A | 5/2014 | | |

* cited by examiner

POWER CONVERTER, HEAT EXCHANGER, HEAT SINK, AND PHOTOVOLTAIC POWER GENERATION SYSTEM

CROSS-REFERENCE TO RELATED APPLICATIONS

This application is a continuation of International Application No. PCT/CN2020/138161, filed on Dec. 22, 2020, the disclosure of which is hereby incorporated by reference in its entirety.

TECHNICAL FIELD

The embodiments relate to heat dissipation devices, a power converter, a heat exchanger, a heat sink, and a photovoltaic power generation system.

BACKGROUND

Photovoltaic power generation is a technology of converting light energy into electric energy by using photovoltaic effect of a semiconductor interface. A photovoltaic power generation system may include parts such as a photovoltaic unit, a power converter, and an alternating current power distribution device.

The power converter used in the photovoltaic power generation system may include a photovoltaic inverter, and a distributed photovoltaic power generation system further includes a maximum power point tracking (MPPT) boost combiner box. The power converter includes environment-sensitive elements such as a power semiconductor device, a magnetic element, and a capacitor, where the magnetic element may include a winding and a magnetic core and may be an inductor device.

In a current solution to heat dissipation performed by a power converter, a magnetic element is exposed in a cavity with a low protection level for ventilation and heat dissipation; the magnetic element is disposed in a metal housing through gluing, and the metal housing is placed outside a chassis or in a cavity with a low protection level for ventilation and heat dissipation; or a power semiconductor device is exposed in a cavity with a low protection level for ventilation and heat dissipation, and other devices are disposed in a cavity with a high protection level for natural heat dissipation through a wall of the cavity with a high protection level.

However, in this solution, environment-sensitive elements such as the power semiconductor device and the magnetic element are directly exposed to the cavity with a low protection level, resulting in poor reliability and a limited heat dissipation capability. In addition, for a solution in which the magnetic element is disposed in the metal housing through gluing, as a power of the power converter continuously increases, heat consumption of the magnetic element gradually increases, a thermal conductivity coefficient of the glue is low and thermal resistance is large, and therefore heat dissipation effect cannot be effectively improved.

In conclusion, in the current solution to heat dissipation performed by the power converter, the reliability and the heat dissipation effect are poor.

SUMMARY

The embodiments may provide a power converter, a heat exchanger, a heat sink, and a photovoltaic power generation system, to improve reliability and heat dissipation effect of heat dissipation performed by the power converter.

According to a first aspect, the embodiments may provide a power converter, and the power converter includes a power semiconductor device, a magnetic element, a sealed cavity, and a heat dissipation cavity. The power semiconductor device and the magnetic element are evenly disposed in the sealed cavity to avoid being exposed. The power semiconductor device and the magnetic element can be strictly protected by the sealed cavity, and the reliability is improved. The power semiconductor device dissipates heat through a first heat sink, and cooling fins of the first heat sink are located in the heat dissipation cavity. The magnetic element may dissipate heat through a heat sink or a heat exchanger. When the magnetic element dissipates the heat through a second heat sink, cooling fins of the second heat sink are located in the heat dissipation cavity. When the magnetic element dissipates the heat through a first heat exchanger, the first heat exchanger is located in the heat dissipation cavity.

According to the solution, the power semiconductor device and the magnetic element are disposed in the sealed cavity for heat dissipation, thereby improving reliability of the power converter. For a power semiconductor device with high heat consumption density, the heat sink is used for heat dissipation, thereby improving heat dissipation efficiency. For the magnetic element, a heat sink or a heat exchanger may be used for heat dissipation. The cooling fins of the used heat sink or the heat exchanger are disposed in the heat dissipation cavity, and the heat dissipation cavity and the sealed cavity are disposed separately. This ensures high protection levels of internal components and implements efficient heat dissipation.

In conclusion, according to the power converter provided in this embodiment, reliability and heat dissipation effect of heat dissipation performed by the power converter are improved.

In a possible implementation, the magnetic element dissipates heat through a first heat exchanger, the sealed cavity includes a first air duct, and the magnetic element is disposed in the first air duct. In a possible implementation, a first end of the first air duct is an air supply vent, a second end of the first air duct is an air return vent, the air supply vent is connected to a first end of the first heat exchanger, and the air return vent is connected to a second end of the first heat exchanger; and at least one first internal circulation fan is further disposed at the air supply vent or the air return vent, and is configured to control an air flow to start from the air supply vent and arrive at the air return vent along an inner cavity of the first air duct, thereby cooling the magnetic element.

In a possible implementation, the sealed cavity further includes a second air duct, a first end of the second air duct is shared with the first end of the first air duct, and a second end of the second air duct is connected to the inner cavity of the first air duct and an inner cavity of the sealed cavity. At least one second internal circulation fan is further disposed in the second air duct and is configured to control an air flow to start from the second air duct and arrive at the air return vent along the inner cavity of the first air duct. When the first internal circulation fan fails, the second internal circulation fan can continue to work, so that the first heat exchanger continues to dissipate heat for the magnetic element. The second internal circulation fan may further dissipate heat for an element with a high protection level in the sealed cavity.

In a possible implementation, at least one second internal circulation fan is further disposed in the sealed cavity. A cavity wall of the first air duct includes a plurality of groups of rebound structures, and each group of rebound structures includes an air duct plate and a cavity wall hole. A force direction of the air duct plate when the air duct plate rebounds points to the inside of the first air duct, an area of the air duct plate is greater than an area of the cavity wall hole, and the air duct plate can cover the entire cavity wall hole.

When the first internal circulation fan works normally, the air duct plate is closed when pressure provided by the air flow is greater than elastic force. When the first internal circulation fan fails, the air duct plate rebounds under an elastic force. When the air duct plate rebounds, the second internal circulation fan controls the air flow to pass through the inner cavity of the sealed cavity and the inner cavity of the first air duct and arrive at the air return vent, thereby cooling the magnetic element.

In a possible implementation, the rebound structure further includes a stop structure, and the stop structure is configured to limit a rebound position of the air duct plate when the air duct plate rebounds.

In a possible implementation, the cooling fins of the first heat sink and the first heat exchanger dissipate the heat in the heat dissipation cavity through air ducts in series, air ducts in parallel, or air ducts independent of each other.

In a possible implementation, the first heat exchanger includes a first air collection cavity, a second air collection cavity, and a connection portion. The connection portion includes at least one tubular channel. The connection portion is configured to connect the first air collection cavity and the second air collection cavity. The first air collection cavity is connected to the air supply vent through a first sealing flange, and the second air collection cavity is connected to the air return vent through a second sealing flange. A separation rib is disposed inside the at least one tubular channel, to improve heat dissipation effect.

In a possible implementation, the connection portion includes at least two tubular channels, and cooling fins are embedded between the at least two tubular channels, to improve heat dissipation effect.

In a possible implementation, the first heat exchanger includes a first sealing flange, a second sealing flange, and at least two bent tubular channels. A first end of the at least two bent tubular channels is connected to the air supply vent through the first sealing flange, and a second end of the at least two bent tubular channels is connected to the air return vent through the second sealing flange. A separation rib is disposed inside the at least two bent tubular channels, to improve heat dissipation effect.

In a possible implementation, cooling fins are embedded between the at least two bent tubular channels.

In a possible implementation, the magnetic element dissipates the heat through the second heat sink and the power converter further includes an element with a high protection level. The element with a high protection level is disposed in the sealed cavity, and the element with a high protection level dissipates heat through a second heat exchanger, and the second heat exchanger is located in the heat dissipation cavity.

In a possible implementation, a third air duct is disposed at a first end of the sealed cavity, a first end of the third air duct is an air supply vent, and a second end of the third air duct is connected to an inner cavity of the sealed cavity. A second end of the sealed cavity is an air return vent, the air supply vent is connected to a first end of the second heat exchanger, and the air return vent is connected to a second end of the second heat exchanger. At least one third internal circulation fan is further disposed at the air supply vent or the air return vent and is configured to control an air flow to start from the air supply vent and arrive at the air return vent along the inner cavity of the sealed cavity.

In a possible implementation, a third air duct is disposed at a first end of the sealed cavity, and a fourth air duct is disposed at a second end of the sealed cavity. A first end of the third air duct is an air supply vent, and a second end of the third air duct is connected to an inner cavity of the sealed cavity. A first end of the fourth air duct is an air return vent, and a second end of the fourth air duct is connected to the inner cavity of the sealed cavity. At least one third internal circulation fan is disposed at the air supply vent, and at least one fourth internal circulation fan is disposed at the air return vent. The third internal circulation fan and the fourth internal circulation fan are configured to control an air flow to start from the air supply vent and arrive at the air return vent along the inner cavity of the sealed cavity.

In a possible implementation, the cooling fins of the first heat sink, the cooling fins of the second heat sink, and the second heat exchanger dissipate the heat in the heat dissipation cavity through air ducts in series, air ducts in parallel, or air ducts independent of each other.

In a possible implementation, the first heat sink and the second heat sink include a substrate and the cooling fins. The cooling fins are configured to perform contact heat dissipation on the substrate. The substrate includes a uniform temperature cavity, and the uniform temperature cavity is filled with a working medium capable of performing gas-liquid phase conversion; and a to-be-dissipated component is disposed at a lower-middle position of the substrate.

In a possible implementation, cooling fins are further disposed in the uniform temperature cavity.

In a possible implementation, the first heat sink and the second heat sink include a substrate, a vapor chamber, and the cooling fins. The cooling fins are configured to perform contact heat dissipation on the substrate, and an inner cavity of the vapor chamber is filled with a working medium capable of performing gas-liquid phase conversion. The vapor chamber is fixedly disposed on the substrate, and a to-be-dissipated component is disposed at a lower-middle position of the vapor chamber, or the vapor chamber is fixedly disposed in an inner cavity of the substrate, and a to-be-dissipated component is disposed at a lower-middle position of the substrate.

In a possible implementation, cooling fins are further disposed in the vapor chamber.

In a possible implementation, the power converter is a central inverter, a string inverter, or a maximum power point tracking (MPPT) boost combiner box.

According to a second aspect, the embodiments may further provide a heat exchanger. The heat exchanger includes a first air collection cavity, a second air collection cavity, and a connection portion. The connection portion includes at least one tubular channel, the at least one tubular channel is configured to connect the first air collection cavity and the second air collection cavity, the first air collection cavity is connected to an air supply vent through a first sealing flange, and the second air collection cavity is connected to an air return vent through a second sealing flange. A separation rib is disposed inside the at least one tubular channel.

In a possible implementation, the connection portion includes at least two tubular channels, and cooling fins are embedded between the at least two tubular channels.

According to a third aspect, the embodiments may further provide another heat exchanger. The heat exchanger includes a first sealing flange, a second sealing flange, and at least two bent tubular channels. A first end of the at least two bent tubular channels is connected to an air supply vent through the first sealing flange, and a second end of the at least two bent tubular channels is connected to an air return vent through the second sealing flange. A separation rib is disposed inside the at least two bent tubular channels.

In a possible implementation, cooling fins are embedded between the at least two bent tubular channels.

According to a fourth aspect, the embodiments may further provide a heat sink. The heat sink includes a substrate and cooling fins. The cooling fins are configured to perform contact heat dissipation on the substrate. The substrate includes a uniform temperature cavity, and the uniform temperature cavity is filled with a working medium capable of performing gas-liquid phase conversion. A to-be-dissipated component is disposed at a lower-middle position of the substrate.

In a possible implementation, cooling fins are further disposed in the uniform temperature cavity.

According to a fifth aspect, the embodiments may further provide another heat sink. The heat sink includes a substrate, a vapor chamber, and cooling fins. The cooling fins are configured to perform contact heat dissipation on the substrate, and an inner cavity of the vapor chamber is filled with a working medium capable of performing gas-liquid phase conversion. The vapor chamber is fixedly disposed on the substrate, and a to-be-dissipated component is disposed at a lower-middle position of the vapor chamber, or the vapor chamber is fixedly disposed in an inner cavity of the substrate, and a to-be-dissipated component is disposed at a lower-middle position of the substrate.

In a possible implementation, cooling fins are further disposed in the vapor chamber.

According to a sixth aspect, the embodiments may further provide a photovoltaic power generation system. The photovoltaic power generation system includes the power converter according to the foregoing implementation, and further includes a photovoltaic unit. The photovoltaic unit includes at least one photovoltaic module, and the photovoltaic unit is configured to convert light energy into a direct current.

DETAILED DESCRIPTION OF THE EMBODIMENTS

To enable a person skilled in the art to better understand the embodiments, the following first describes an application scenario.

The following first describes a photovoltaic power generation system based on a central inverter.

Figure 1:
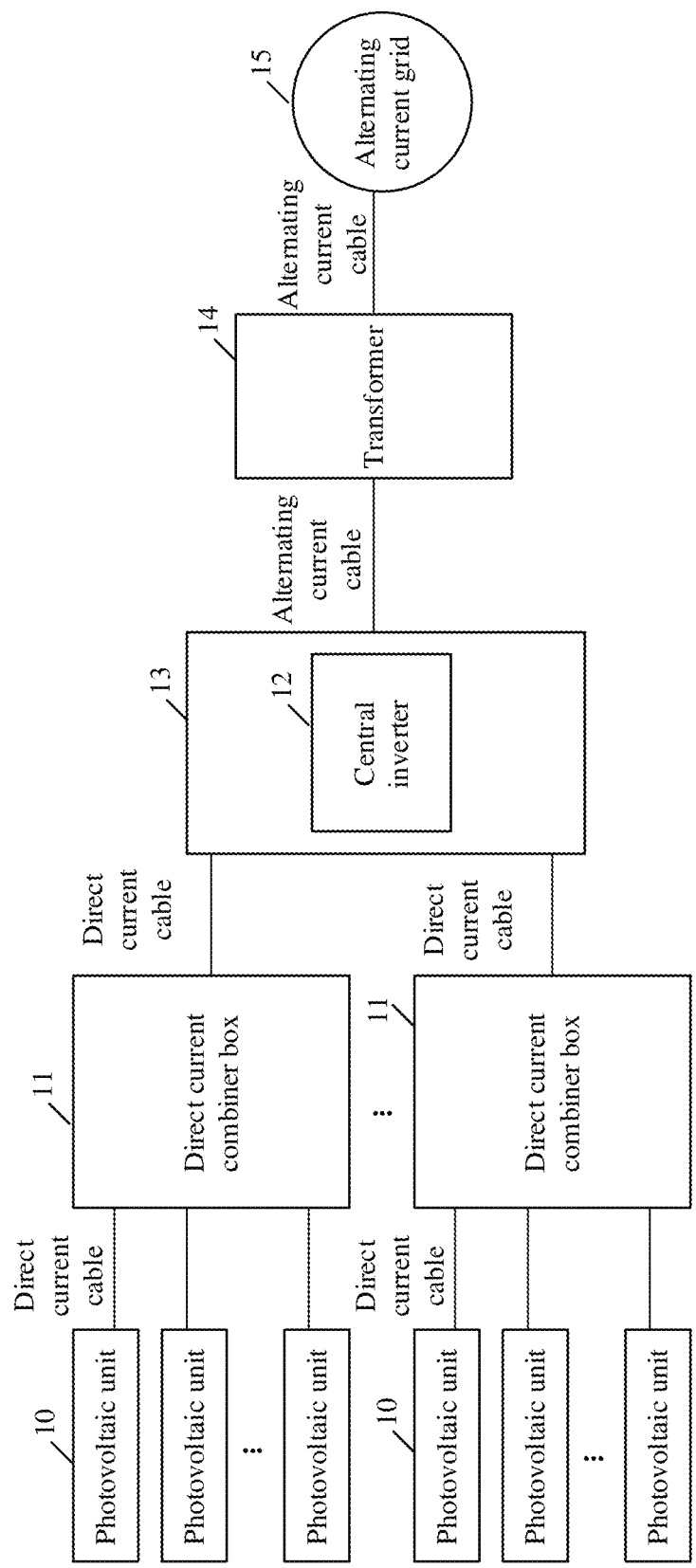
FIG. 1 is a schematic diagram of a photovoltaic power generation system based on a central inverter.

FIG. 1 is a schematic diagram of a photovoltaic power generation system based on a central inverter.

The photovoltaic power generation system includes a photovoltaic unit 10, a direct current combiner box 11, a central inverter 12, and a transformer 14.

Each photovoltaic unit 10 includes one or more photovoltaic modules. The photovoltaic module is a direct current power supply formed by packaging solar cells in series or in parallel and is configured to convert light energy into electric energy.

When the photovoltaic unit 10 includes a plurality of photovoltaic modules, the plurality of photovoltaic modules may form a photovoltaic string by connecting a positive electrode and a negative electrode in series, to form the photovoltaic unit 10. Alternatively, the plurality of photovoltaic modules may be first connected in series to form a plurality of photovoltaic strings, and then the plurality of photovoltaic strings may be connected in parallel to form the photovoltaic unit 10.

The central inverter 12 includes a direct current (DC)-alternating current (AC) circuit, which may also be referred to as an inverter circuit and is configured to invert a direct current input by at least one direct current combiner box 11 to an alternating current. A power of the central inverter 12 is relatively high and therefore a cabinet may be. The central inverter 12 may be disposed in an equipment room or a container 13. A central inverter with a power greater than 500 kW may be used in a photovoltaic power station.

An alternating current output by the central inverter 12 is converted by the transformer 14 and then is converged into the alternating current power grid 15.

The following describes a photovoltaic power generation system based on a string inverter.

Figure 2:
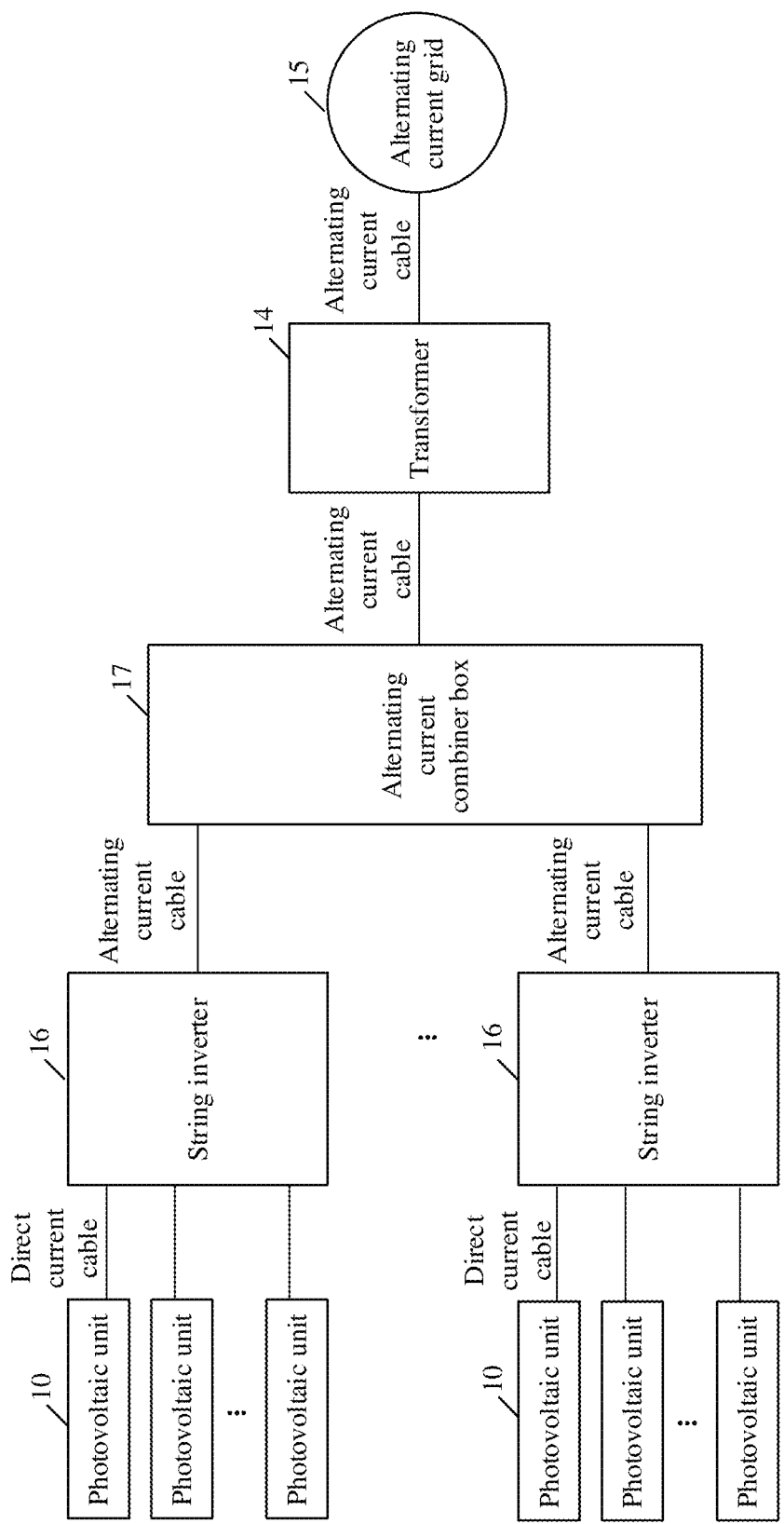
FIG. 2 is a schematic diagram of a photovoltaic power generation system based on a string inverter.

FIG. 2 is a schematic diagram of a photovoltaic power generation system based on a string inverter.

The photovoltaic power generation system includes a photovoltaic unit 10, a string inverter 16, an alternating current combiner box 17, and a transformer 14.

A direct current side of the string inverter 16 is connected to one or more photovoltaic units 10. In actual application, the direct current side of the string inverter 16 may be connected to a plurality of photovoltaic units 10.

The following describes an implementation of a string inverter.

Figure 3:
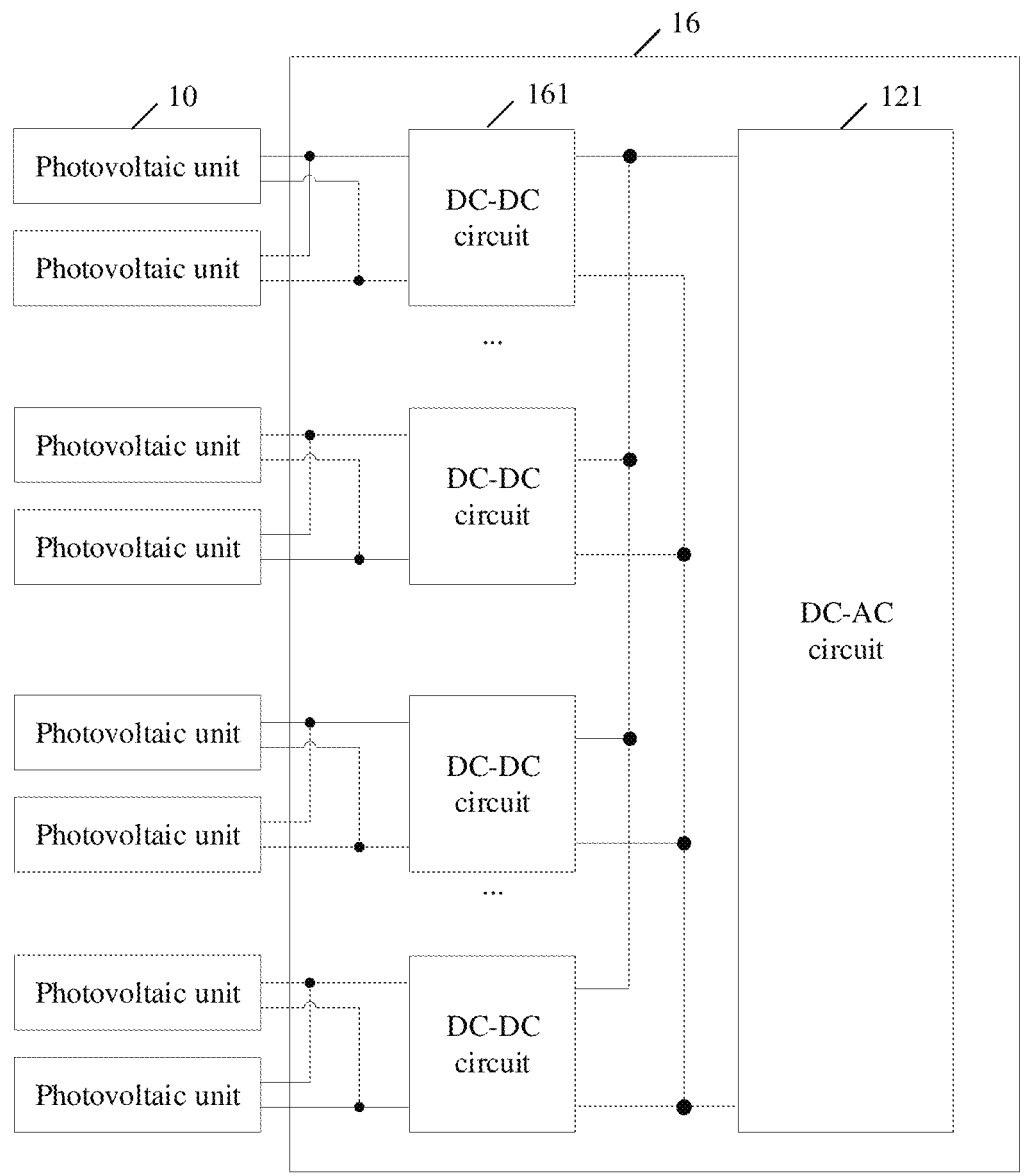
FIG. 3 is a schematic diagram of a string inverter according to an embodiment.

FIG. 3 is a schematic diagram of a string inverter according to an embodiment.

A power of the string inverter 16 is smaller than that of the central inverter, and an outdoor modular design is usually adopted, including two layers of power conversion circuits, where a first layer is a DC-DC circuit 161, which may be a boost circuit, and a second layer is a DC-AC circuit 121, that is, an inverter circuit.

The string inverter 16 may include a plurality of DC-DC circuits 161. Positive output ends of the plurality of DC-DC circuits 161 are connected in parallel to a positive input end on a direct current side of the DC-AC circuit 121, and negative output ends of the plurality of DC-DC circuits 161 are connected in parallel to a negative input end on the direct current side of the DC-AC circuit 121.

An alternating current outlet end of the DC-AC circuit 121 is an output end of the string inverter 16.

Each DC-DC circuit 161 is connected to at least one photovoltaic unit 10, a positive input end of each DC-DC circuit 161 is connected to a positive electrode of the photovoltaic unit 10, and a negative input end of each DC-DC circuit 161 is connected to a negative electrode of the photovoltaic unit 10.

Alternating currents output by a plurality of string inverters 16 are converged after passing through the alternating current combiner box 17, and then are converted by the transformer 14 and then connected to the alternating current power grid 15.

The following describes a photovoltaic power generation system based on a central inverter and a maximum power point tracking (MPPT) boost combiner box. The photovoltaic power generation system is also referred to as a distributed photovoltaic power generation system.

Figure 4:
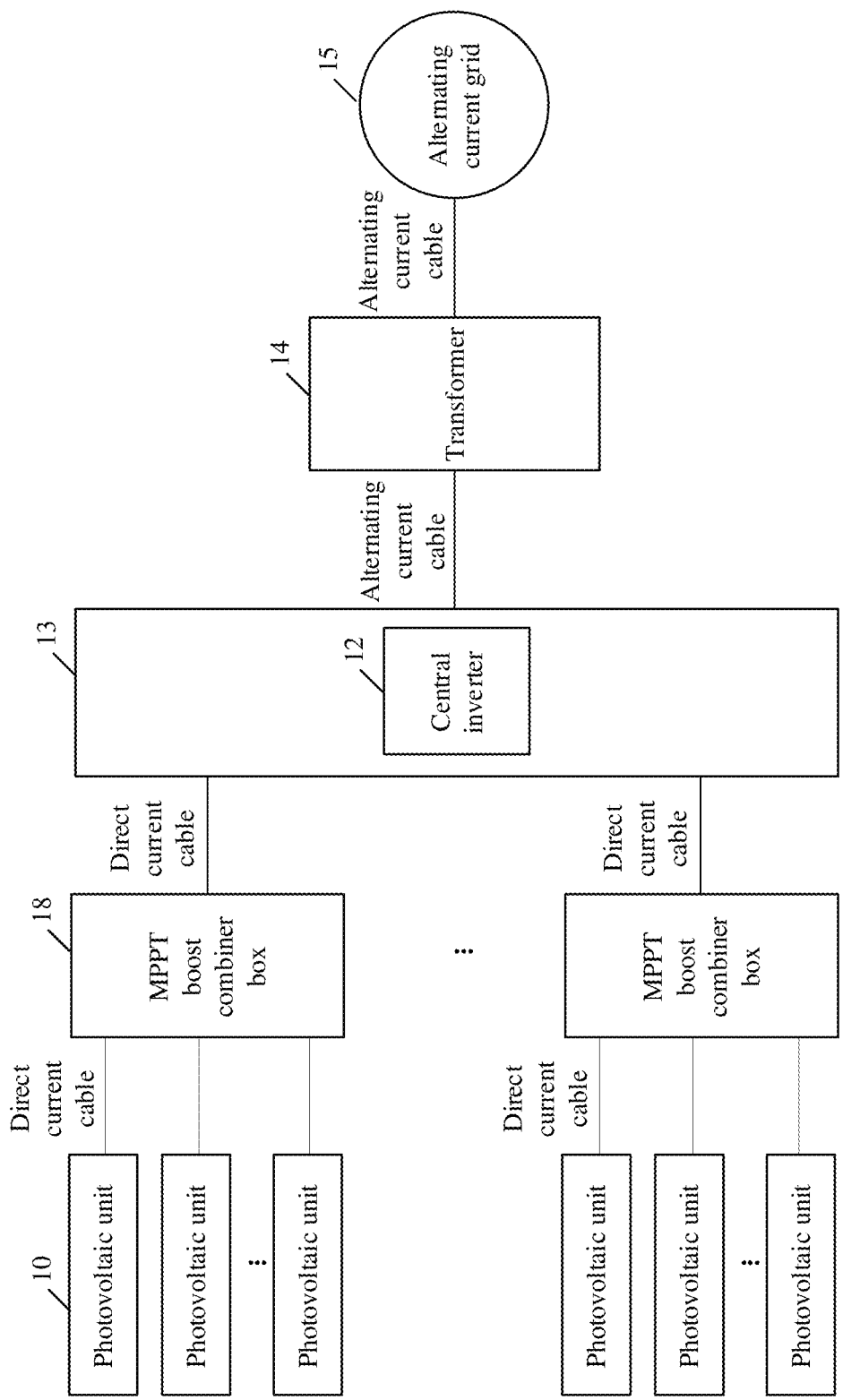
FIG. 4 is a schematic diagram of a photovoltaic power generation system based on a central inverter and an MPPT boost combiner box.

FIG. 4 is a schematic diagram of a photovoltaic power generation system based on a central inverter and an MPPT boost combiner box.

The photovoltaic power generation system shown in the figure includes a photovoltaic unit 10, an MPPT boost combiner box 18, a central inverter 21, and a transformer 14.

The MPPT boost combiner box 18 is a boost converter and may be described below with reference to the accompanying drawings.

Figure 5:
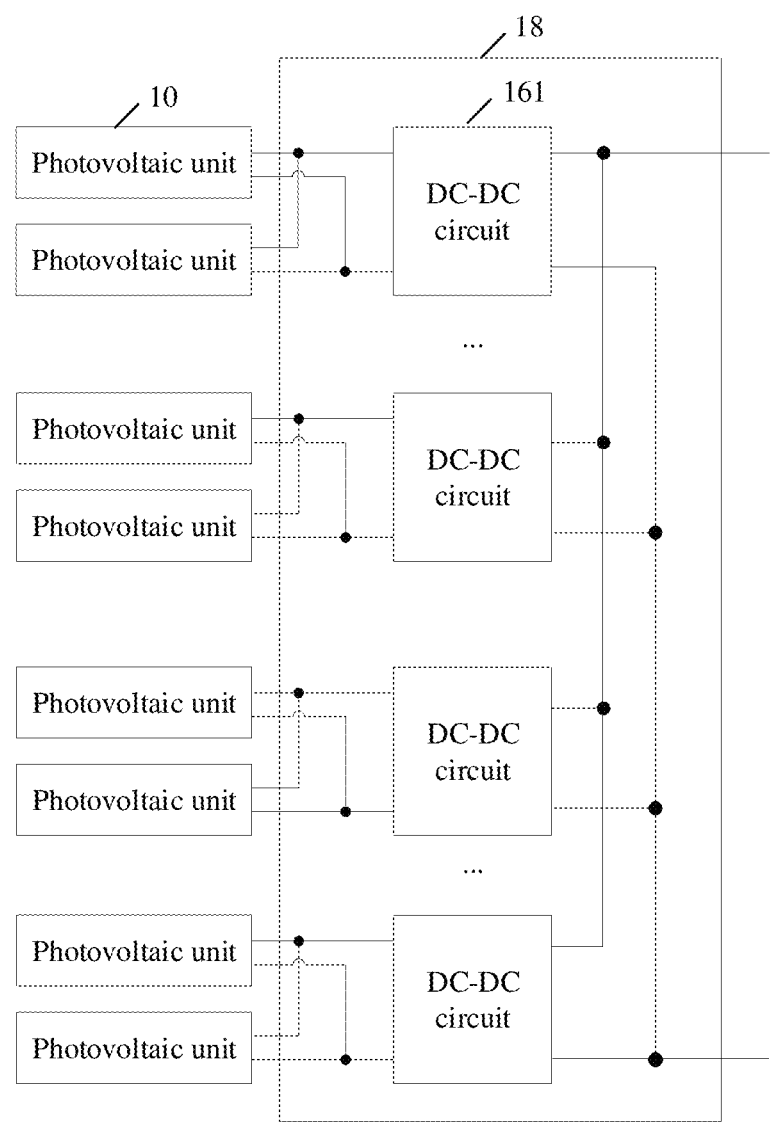
FIG. 5 is a schematic diagram of an MPPT boost combiner box according to an embodiment.

FIG. 5 is a schematic diagram of an MPPT boost combiner box according to an embodiment.

The MPPT boost combiner box 20 may include at least two DC-DC circuits 161. Each DC-DC circuit 161 is connected to at least one photovoltaic unit 10. A positive input end of each DC-DC circuit 161 is connected to a positive electrode of the photovoltaic unit 10, and a negative input end of the DC-DC circuit 161 is connected to a negative electrode of the photovoltaic unit 10.

A positive output end of each DC-DC circuit 161 is connected in parallel to a positive electrode of an output direct current bus, and a negative output end of each DC-DC circuit 161 is connected in parallel to a negative electrode of the output direct current bus.

The positive electrode and the negative electrode of the direct current bus are respectively used as a positive output end and a negative output end of the MPPT boost combiner box 20 and are respectively connected to a positive input end and a negative input end of a subsequent central inverter 12 through a direct current cable.

The central inverter 12 is configured to convert one or more parallel direct current inputs connected to a direct current side into alternating current outputs, and DC-AC single-stage power conversion may be used. The alternating current output by the central inverter 21 is converted by the transformer 14 and then is converged into an alternating current power grid 15.

The central inverter 12 may be far away from the photovoltaic unit 10 in electrical distance, and an outdoor cabinet or outdoor modular integration may be adopted.

The following describes a photovoltaic power generation system based on a photovoltaic optimizer and a string inverter.

Figure 6:
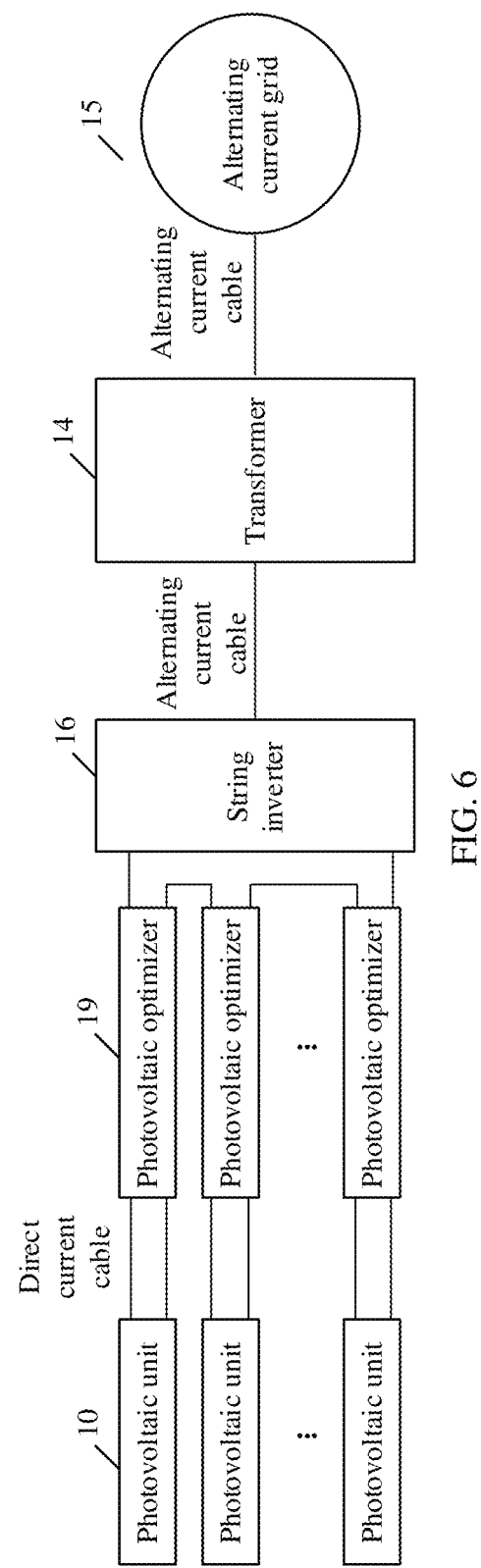
FIG. 6 is a schematic diagram of a photovoltaic power generation system based on a photovoltaic optimizer and a string inverter.

FIG. 6 is a schematic diagram of a photovoltaic power generation system based on a photovoltaic optimizer and a string inverter.

The photovoltaic power generation system shown in the figure includes a photovoltaic unit 10, a photovoltaic optimizer 19, a string inverter 16, a transformer 14, and an alternating current power grid 15.

The photovoltaic optimizer 19 is a DC-DC converter. An input of the photovoltaic optimizer 19 is connected to the photovoltaic unit 10, and an output of the photovoltaic optimizer 19 is connected to the string inverter 16 in series. In some other embodiments, the photovoltaic optimizer 19 may alternatively be connected to a central inverter. The photovoltaic optimizer 19 is configured to increase or decrease an output voltage of the photovoltaic unit 10.

The photovoltaic optimizer 19 includes a DC-DC circuit. The DC-DC circuit may be a buck circuit, a boost circuit, or a buck-boost circuit. A positive input end of the DC-DC circuit is connected to a positive electrode of the photovoltaic unit 10, and a negative input end of the DC-DC circuit is connected to a negative electrode of the photovoltaic unit 10.

A positive electrode of the DC-DC circuit is connected to a positive electrode of an output direct current bus, and is used as a positive output end of the photovoltaic optimizer 19; and a negative electrode of the DC-DC circuit is connected to a negative electrode of the output direct current bus, and is used as a negative output end of the photovoltaic optimizer 19.

In a photovoltaic power generation system in which the photovoltaic optimizer 19 is used, a plurality of photovoltaic optimizers 19 may be connected in series to form a sub-string.

For example, N photovoltaic optimizers are connected in series from head to tail. A positive output end of an $i^{th}$ photovoltaic optimizer may be connected to a negative output end of an (i−1)th photovoltaic optimizer and a negative output end of the $i^{th}$ photovoltaic optimizer may be connected to a positive output end of an $(i+1)^{th}$ photovoltaic optimizer, where i=2, 3, . . . , N−1. A positive output end of a first photovoltaic optimizer is used as a positive output end of the photovoltaic optimizer substring, and a negative output end of an $N^{th}$ photovoltaic optimizer is used as a negative output end of the photovoltaic optimizer substring. The output end of the photovoltaic optimizer substring is connected to an input end of a subsequent string inverter or central inverter through a direct current power cable.

An alternating current output by the string inverter 16 is converted by the transformer 14 and then is converged into the alternating current power grid 15.

As an output power of the photovoltaic power generation system increases, a total output power of the photovoltaic unit 10 continuously increases. Therefore, it is an inevitable trend that power density of power converters, such as a central inverter, an MPPT boost combiner box, and a string inverter, used in the foregoing various photovoltaic power generation systems continuously increases. Consequently, heat dissipation is more challenging.

During heat dissipation performed by a current power converter, a magnetic element is exposed in a cavity with a low protection level for ventilation and heat dissipation; the magnetic element is disposed in a metal housing through gluing, and the metal housing is placed outside a chassis or in a cavity with a low protection level for ventilation and heat dissipation; or a power semiconductor device is exposed in a cavity with a low protection level for ventilation and heat dissipation, and other devices are disposed in a cavity with a high protection level for natural heat dissipation through a wall of the cavity with a high protection level.

However, in this solution, environment-sensitive elements such as the power semiconductor device and the magnetic element are directly exposed to the cavity with a low protection level, resulting in poor reliability and a limited heat dissipation capability. In addition, for a solution in which the magnetic element is disposed in the metal housing through gluing, as a power of the power converter continuously increases, heat consumption of the magnetic element gradually increases, a thermal conductivity coefficient of the glue is low and thermal resistance is large, and therefore heat dissipation effect cannot be effectively improved.

To resolve the foregoing problem, the embodiments may provide a power converter, a heat exchanger, a heat sink, and a photovoltaic power generation system. A power semiconductor device and a magnetic element are disposed in a sealed cavity for heat dissipation, thereby improving reliability of the power converter. For a power semiconductor device with high heat consumption density, the heat sink is used for heat dissipation, thereby improving heat dissipation efficiency. For the magnetic element, a heat sink or a heat exchanger may be used for heat dissipation. In addition, the cooling fins of the used heat sink or the heat exchanger are disposed in a heat dissipation cavity, and the heat dissipation cavity and the sealed cavity are disposed separately. This ensures high protection levels and implements efficient heat dissipation.

The following describes in detail the embodiments with reference to accompanying drawings.

In the following description, terms such as "first" and "second" are used only for description purposes and cannot be understood as indicating or implying relative importance or implicitly indicating a quantity of indicated features.

Unless otherwise clearly specified and limited, a term "connection" should be understood in a broad sense. For example, a "connection" may be a fixed connection, a detachable connection, or an integrated structure, may be a direct connection, or may be an indirect connection through an intermediary.

An example of the magnetic element in the embodiments is an inductor.

The following first describes a solution in which a magnetic element dissipates heat through a heat exchanger.

Figure 7:
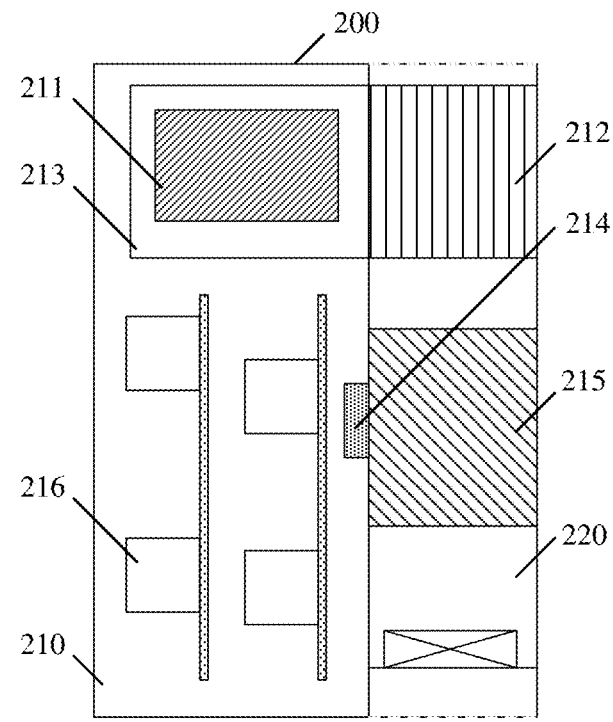
FIG. 7 is a side view of a power converter according to an embodiment.
Figure 8:
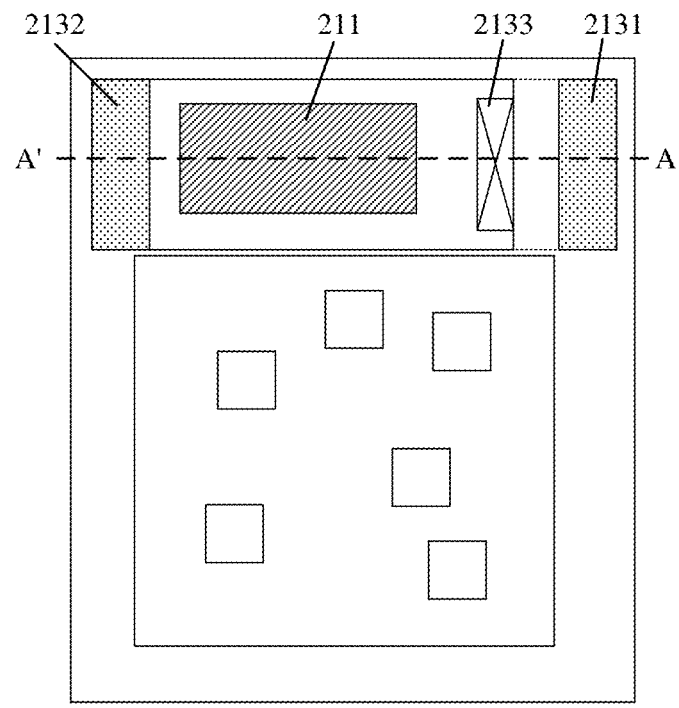
FIG. 8 is a main view corresponding to the power converter shown in FIG. 7 according to an embodiment.
Figure 9:
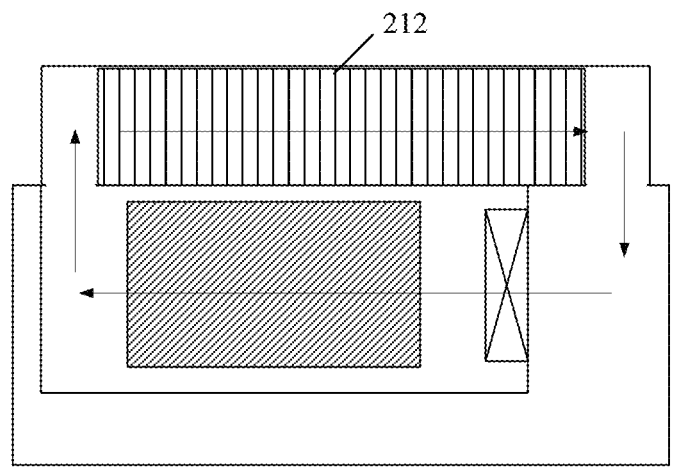
FIG. 9 is an A-A' sectional view of the power converter in FIG. 8 according to an embodiment.

For details, refer to FIG. 7 to FIG. 9 together. FIG. 7 is a side view of a power converter according to an embodiment. FIG. 8 is a main view corresponding to the power converter shown in FIG. 7 according to an embodiment. FIG. 9 is an A-A' sectional view of the power converter in FIG. 8 according to an embodiment.

The power converter 200 shown in the figure includes a magnetic element 211, a semiconductor device 214, a sealed cavity 210, and a heat dissipation cavity 220.

The power semiconductor device 214 and the magnetic element 211 are disposed in the sealed cavity 210.

The power semiconductor device 214 dissipates heat through a first heat sink 215, and cooling fins of the first heat sink 215 are located in the heat dissipation cavity 220.

The magnetic element 211 dissipates heat through a first heat exchanger 212, and the first heat exchanger 212 is located in the heat dissipation cavity 220, which is described in detail below.

The sealed cavity 210 includes a first air duct 213, and the magnetic element 211 is disposed in the first air duct 213. The first air duct 213 is configured to restrict a flow direction of air to be dissipated for the magnetic element 211. In a possible implementation, the first air duct 213 is a sealed air duct.

As shown in FIG. 8, a first end of the first air duct is an air supply vent 2131, and the air supply vent 2131 is connected to a first end of the first heat exchanger 212 and is configured to receive air from the first heat exchanger 212. A second end of the first air duct is an air return vent 2132, and the air return vent 2132 is connected to a second end of the first heat exchanger 212 and is configured to send the air into the first heat exchanger 212.

At least one first internal circulation fan 2133 is further disposed at the air supply vent 2131 or the air return vent 2132 and is configured to control an air flow to start from the air supply vent 2131 and arrive at the air return vent 2132 along an inner cavity of the first air duct, thereby cooling the magnetic element 211.

In some embodiments, at least one first internal circulation fan 2133 may be disposed at both the air supply vent 2131 and the air return vent 2132, to improve heat dissipation effect.

In this case, a flow loop of the air may be shown in FIG. 9. The air starts from the air supply vent 2131, passes through the magnetic element 211 along the first air duct, and changes into high-temperature air after heat exchange with the magnetic element 211. The air returns to the first heat exchanger 212 through the air return vent 2132, completes heat exchange with external air (or another cooling medium) to change into low-temperature air, and then returns to the inside of the first air duct through the air supply vent 2131. The air circulates according to this process.

The sealed cavity 210 further includes an element 216 with a high protection level, for example, a component with a low heat consumption density such as a board circuit and a controller. The sealed cavity 210 ensures security of the element 216 with a high protection level.

A type of the power semiconductor device is not limited in this embodiment. In some embodiments, the power semiconductor device may be an insulated gate bipolar transistor (IGBT), a metal-oxide-semiconductor field-effect transistor (MOSFET), a silicon carbide (SiC) metal-oxide semiconductor field-effect transistor (MOSFET), or the like.

The power converter 200 in this embodiment may be a central inverter, a string inverter, or an MPPT boost combiner box. This is not limited in this embodiment.

When two ends of the first air duct 213 are connected to two ends of the first heat exchanger 212, both ends may be connected in a sealed manner; or one end of the first air duct 213 and the first heat exchanger 212 is connected in a sealed manner, and the other end of the first air duct 213 and the first heat exchanger 212 is connected through an inner cavity of the sealed cavity. In this case, an end of the first air duct 213 should be relatively close to an end of the first heat exchanger 212. Alternatively, the two ends of the first air duct 213 are connected to the two ends of the first heat exchanger 212 through the inner cavity of the sealed cavity. In this case, the ends on the two sides of the first air duct 213 should be relatively close to the ends on the two sides of the first heat exchanger 212.

In conclusion, according to the solution provided in the embodiments, the power semiconductor device and the magnetic element are disposed in the sealed cavity for heat dissipation, thereby improving reliability of the power converter. For a power semiconductor device with high heat consumption density, the heat sink is used for heat dissipation, thereby improving heat dissipation efficiency, and the heat exchanger is used for heat dissipation of the magnetic element. In addition, the cooling fins of the used heat sink or the heat exchanger are disposed in the heat dissipation cavity, and the heat dissipation cavity and the sealed cavity are disposed separately. This ensures high protection levels and implements efficient heat dissipation.

The power converter 200 in the foregoing embodiment may have a single air duct. To ensure that the first heat exchanger 212 may further continue to dissipate heat for the magnetic element 211 when a fan in the first air duct 213 fails, the embodiments may further provide another power converter, which may have two air ducts. The following provides descriptions with reference to the accompanying drawings.

Figure 10:
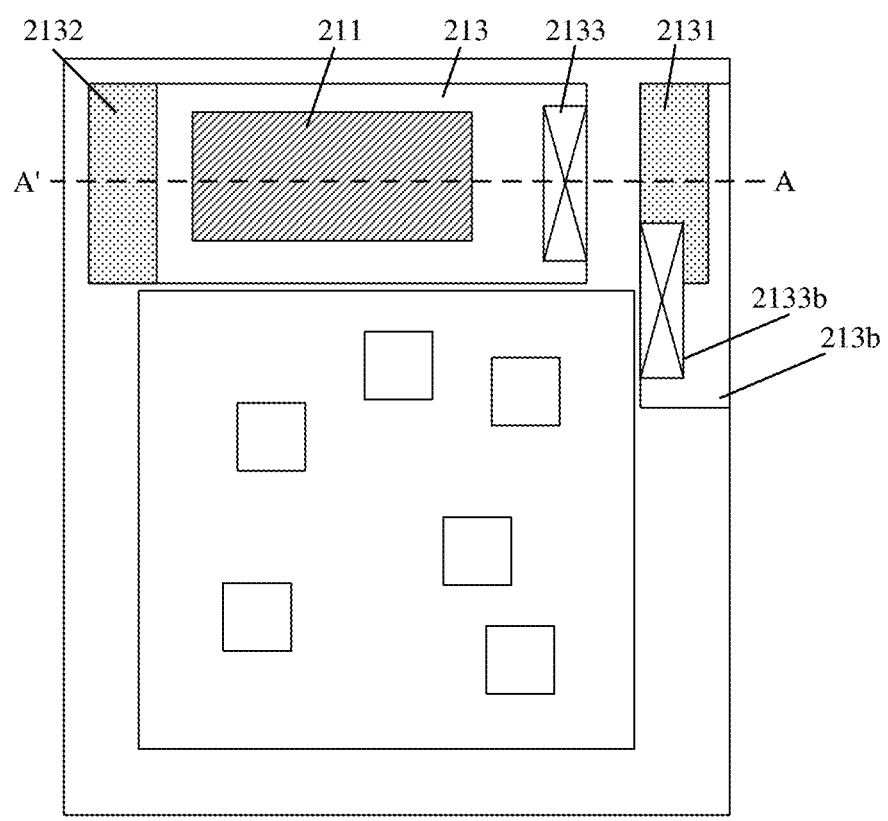
FIG. 10 is a main view of another power converter according to an embodiment.
Figure 11:
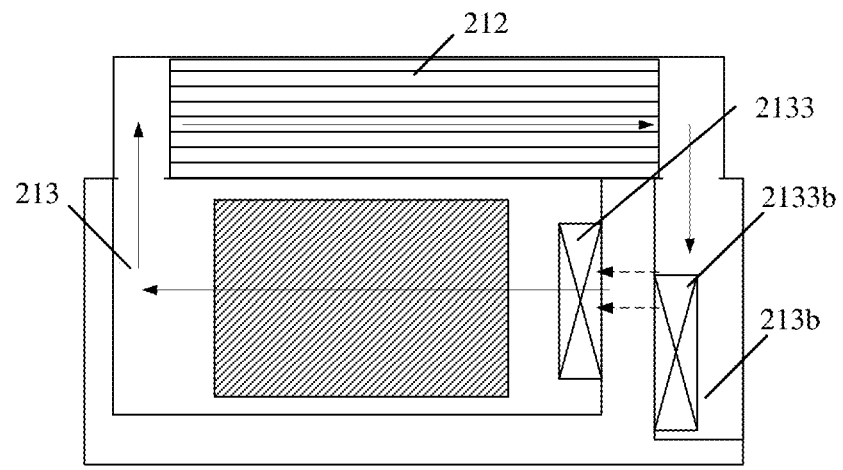
FIG. 11 is an A-A' sectional view of the power converter in FIG. 10 according to an embodiment.

Reference is made to both FIG. 10 and FIG. 11. FIG. 10 is a main view of another power converter according to an embodiment. FIG. 11 is an A-A' sectional view of the power converter in FIG. 10 according to an embodiment.

As shown in the figure, a sealed cavity 210 further includes a second air duct 213b, a first end of the second air duct 213b is shared with a first end of the first air duct 213, and a second end of the second air duct 213b is connected to an inner cavity of the first air duct 213.

A first internal circulation fan 2133 controls an air flow to start from an air supply vent 2131, flow along the first air duct 213 through a magnetic element 211 and change into high-temperature air after heat exchange with the magnetic element 211 and return to a first heat exchanger 212 through an air return vent 2132. For the air circulation direction, refer to solid line arrows in FIG. 11.

At least one second internal circulation fan 2133b is further disposed in the second air duct 213b, and is configured to control an air flow to start from the second air duct 213b, enter the first air duct 213 through a path shown by a dashed arrow in FIG. 11, and then arrive at the air return vent 2132 along the inner cavity of the first air duct 213.

In this case, when the first internal circulation fan 2133 in the first air duct 213 fails partially or completely, the second internal circulation fan 2133b may be started, so that the first heat exchanger 212 can still dissipate heat normally.

The following describes, with reference to the accompanying drawings, another power converter that is in a rebound structure.

Figure 12:
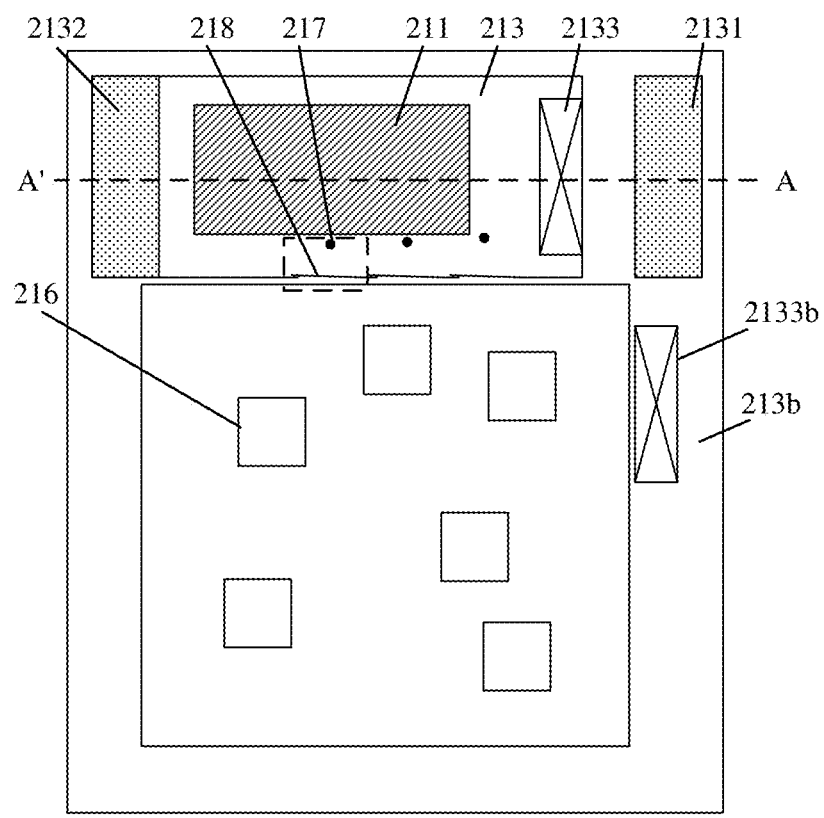
FIG. 12 is a main view when an air duct plate of a power converter is closed according to an embodiment.
Figure 13:
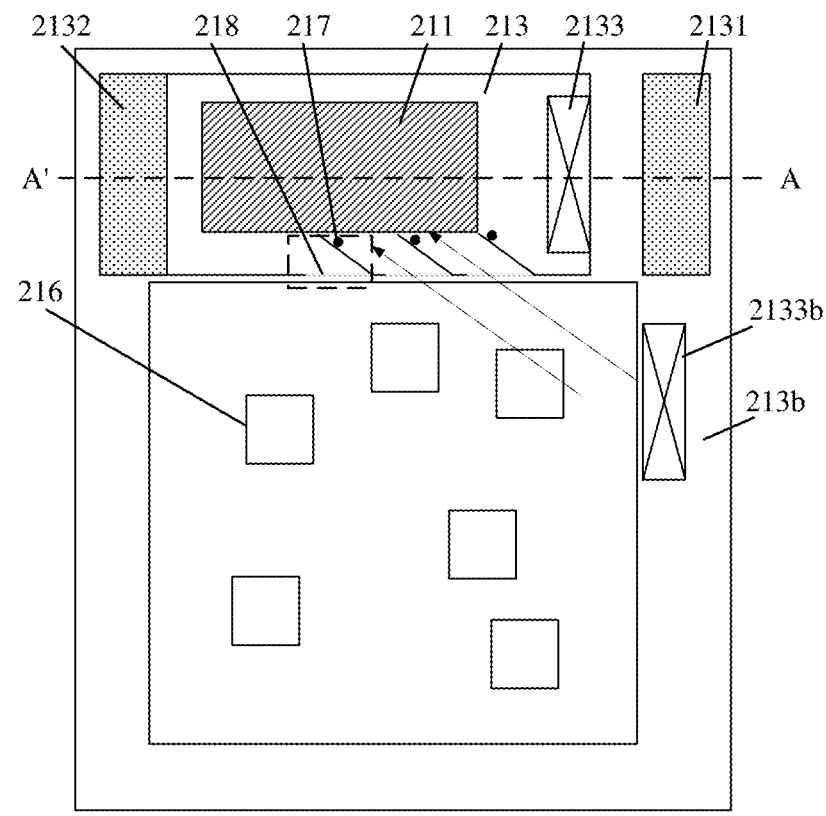
FIG. 13 is a main view when an air duct plate of a power converter is opened according to an embodiment.
Figure 14:
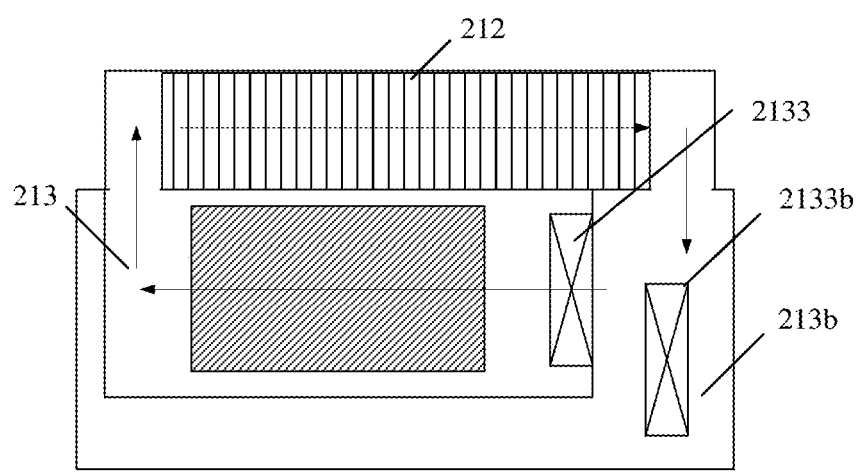
FIG. 14 is an A-A' sectional view of the power converter in FIG. 12 according to an embodiment.

Reference is made to FIG. 12 to FIG. 14. FIG. 12 is a main view when an air duct plate of a power converter is closed according to an embodiment. FIG. 13 is a main view when an air duct plate of a power converter is opened according to an embodiment. FIG. 14 is an A-A' sectional view of the power converter in FIG. 12 according to an embodiment.

A sealed cavity shown in the figure includes a second air duct 213b. In some embodiments, the second air duct 213b includes another sealed area other than a first air duct 213 in the sealed cavity. In some other embodiments, the second air duct 213b is an air duct disposed separately.

A first end of the second air duct 213b is shared with a first end of the first air duct 213, and a second end of the second air duct 213b is connected to an inner cavity of the sealed cavity.

A cavity wall of the first air duct 213 includes a plurality of groups of rebound structures. As shown in a dashed-line box in the figure, each group of rebound structures includes an air duct plate 218 and a cavity wall hole.

A quantity of the rebound structures is not limited in this embodiment and may be determined according to an actual cavity wall length of the first air duct 213.

A force direction of the air duct plate 218 when the air duct plate 218 rebounds points to the inside of the first air duct 213, an area of the air duct plate 218 is greater than an area of a cavity wall hole, and the air duct plate 218 can completely cover the corresponding cavity wall hole. In this case, after the air duct plate 218 is inserted into the corresponding cavity wall hole, the first air duct 213 can be in a closed state.

At least one second internal circulation fan 2133b is further disposed in the second air duct 213b.

When the first internal circulation fan 2133 of the first air duct 213 works normally, the air duct plate 218 overcomes its own elastic force under the impact of atmospheric pressure and is inserted into a corresponding cavity wall hole. An air flow starts from the air supply vent 2131, passes through the magnetic element 211 along the first air duct 213, changes into high-temperature air after heat exchange with the magnetic element 211, and returns to the first heat exchanger 212 through the air return vent 2132. In this case, the air flow cycle may be shown by a solid line arrow in FIG. 14.

As shown in FIG. 13, when the first internal circulation fan 2133 is partially or completely faulty, the air duct plate 218 rebounds, a hole appears on a cavity wall of the first air duct 213, and the second internal circulation fan 2133b controls the air flow to start from the second air duct 213b, sequentially pass through the inner cavity of the sealed cavity and the inner cavity of the first air duct 213, and then arrive at the air return vent 2132, to implement heat dissipation for the magnetic element 211.

The second internal circulation fan 2133b may further dissipate heat for the element 216 with a high protection level in the sealed cavity.

In some embodiments, each group of rebound structures further includes a stop structure 217. The stop structure 217 may be used as a stop post or a stop pin and may be used to limit a rebound position of the air duct plate 218 when the air duct plate 218 rebounds.

In some embodiments, to prevent the air duct plate 218 from rebounding when the first internal circulation fan 2133 works normally, the rebound structure is placed close to the first internal circulation fan 2133, to ensure that the atmospheric pressure on the air duct plate 218 is enough to overcome rebounding force.

In the power converter provided in the foregoing embodiments, the first heat exchanger is used to dissipate heat for the magnetic element, and the first heat sink is used to dissipate heat for the power semiconductor device. In the heat dissipation cavity, the cooling fins of the first heat sink and the first heat exchanger may dissipate the heat through air ducts in series, air ducts in parallel, or air ducts independent of each other, or may dissipate the heat through a cooling medium. This is not limited in this embodiment.

The following describes an implementation in which a heat sink is used to dissipate heat for a magnetic element, and a heat exchanger is used to dissipate heat for an element with a high protection level.

Figure 15:
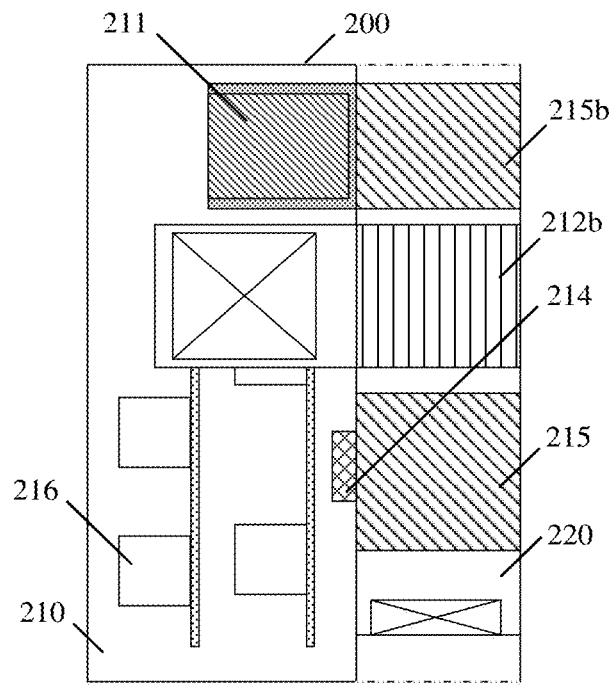
FIG. 15 is a side view of another power converter according to an embodiment.
Figure 16:
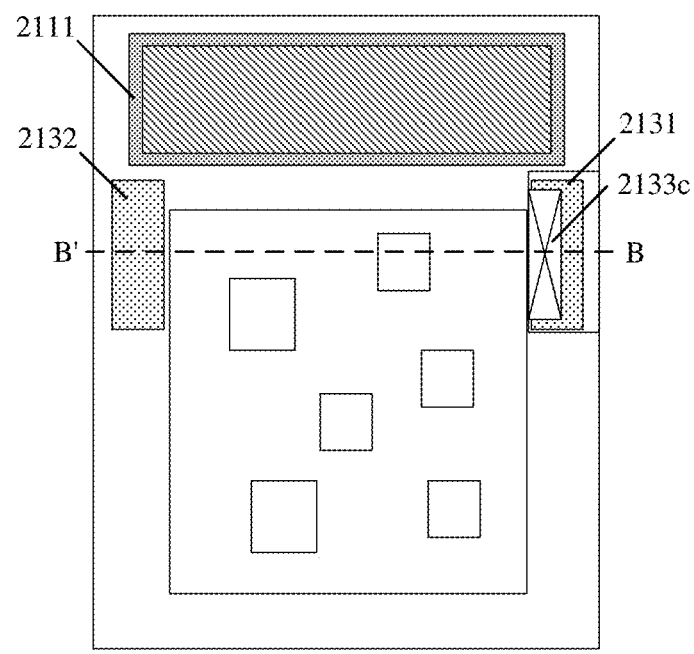
FIG. 16 is a main view of the power converter shown in FIG. 15 according to an embodiment.
Figure 17:
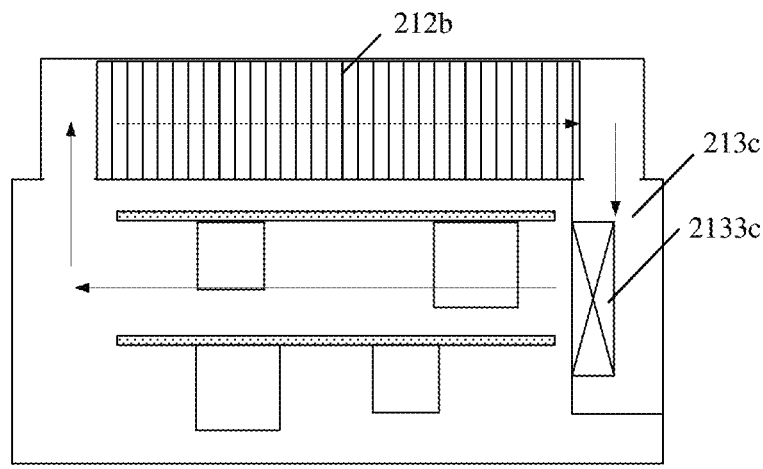
FIG. 17 is a B-B' sectional view of the power converter in FIG. 16 according to an embodiment.

Reference is made to FIG. 15 to FIG. 17. FIG. 15 is a side view of another power converter according to an embodiment. FIG. 16 is a main view of the power converter shown in FIG. 15 according to an embodiment. FIG. 17 is a B-B' sectional view of the power converter in FIG. 16 according to an embodiment.

A power semiconductor device 214 of the power converter 200 dissipates heat through a first heat sink 215, and cooling fins of the first heat sink 215 are located in a heat dissipation cavity 220.

A magnetic element 211 of the power converter 200 dissipates heat through a second heat sink 215b, and cooling fins of the second heat sink 215b are located in the heat dissipation cavity 220.

In some embodiments, the magnetic element 211 may be disposed in a metal housing 2111, and then the metal housing 2111 is fastened to the second heat sink 215b. In some other embodiments, the magnetic element 211 may be directly glued and fastened to the second heat sink 215b. In still some other embodiments, the magnetic element 211 may be attached to the second heat sink 215b by using a thermal pad.

To improve heat dissipation efficiency, a thermal interface material (TIM) may be covered outside the magnetic element 211. A type of the thermal interface material is not limited.

The element 216 with a high protection level of the power converter 200 is disposed in a sealed cavity 210, the element 216 with a high protection level dissipates heat through a second heat exchanger 212b, and the second heat exchanger 212b is located in the heat dissipation cavity 220.

In this case, a third air duct 213c is disposed at a first end of the sealed cavity 210, a first end of the third air duct 213c is an air supply vent 2131, and a second end of the third air duct 213c is connected to an inner cavity of the sealed cavity 210.

A second end of the sealed cavity 210 is an air return vent 2132.

The air supply vent 2131 is connected to a first end of the second heat exchanger 212b, and the air return vent 2132 is connected to a second end of the second heat exchanger 212b.

At least one third internal circulation fan 2133c is further disposed at the air supply vent 2131 or the air return vent 2132, and is configured to control an air flow to start from the air supply vent 2131, complete heat exchange with the element 216 with a high protection level along the inner cavity of the sealed cavity, and then change into high-temperature air, and enter the second heat exchanger 212b through the air return vent 2132, to dissipate heat for the element 216 with a high protection level. In this case, for an air circulation path, reference may be made to a solid line arrow in FIG. 17.

In conclusion, according to the power converter provided in this embodiment, the power semiconductor device and the magnetic element are disposed in the sealed cavity for heat dissipation, and the heat exchanger dissipates heat for the element with a high protection level. The heat dissipation cavity and the sealed cavity are disposed separately, so that high protection levels of internal components are ensured, and efficient heat dissipation is implemented.

The power converter 200 in the foregoing embodiment may have a single air duct. To ensure that the second heat exchanger 212b may further continue to dissipate heat for the element with a high protection level when a fan in the third air duct 213c fails, the embodiments may further provide another power converter, which may have two air ducts. The following provides descriptions with reference to the accompanying drawings.

Figure 18:
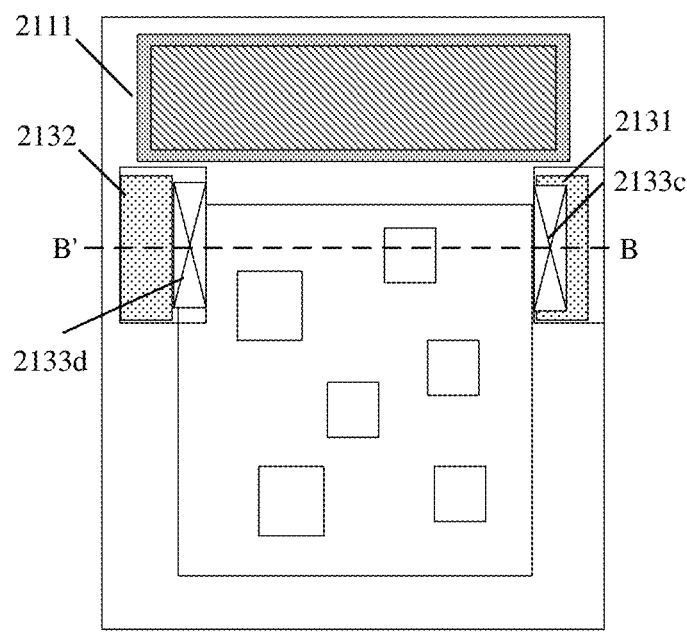
FIG. 18 is a main view of another power converter according to an embodiment.
Figure 19:
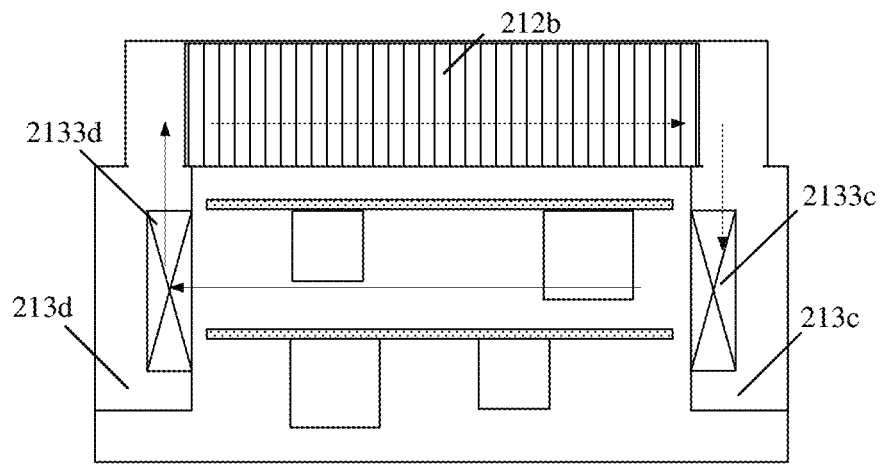
FIG. 19 is a B-B' sectional view of the power converter in FIG. 18 according to an embodiment.

Reference is made to both FIG. 18 and FIG. 19. FIG. 18 is a main view of another power converter according to an embodiment. FIG. 19 is a B-B' sectional view of the power converter in FIG. 18 according to an embodiment.

A difference between the power converter shown in the figures and the power converter in FIG. 15 to FIG. 17 lies in that a third air duct 213c is disposed at a first end of a sealed cavity 210, and a fourth air duct 213d is disposed at a second end of the sealed cavity 210.

A first end of the third air duct 213c is an air supply vent 2131, and a second end of the third air duct 213c is connected to an inner cavity of the sealed cavity 210.

A first end of the fourth air duct 213d is an air return vent 2132, and a second end of the fourth air duct 213d is connected to the inner cavity of the sealed cavity 210.

At least one third internal circulation fan 2133c is disposed at the air supply vent 2131, and at least one fourth internal circulation fan 2133d is disposed at the air return vent 2132.

The third internal circulation fan 2133c and the fourth internal circulation fan 2133d are configured to control an air flow to start from the air supply vent 2131 and arrive at the air return vent 2132 along the inner cavity of the sealed cavity. In this case, for an air circulation path, refer to a solid line arrow in FIG. 19.

The third internal circulation fan 2133c and the fourth internal circulation fan 2133d may be simultaneously started, or one of them is started. For example, the third internal circulation fan 2133c is started and the fourth internal circulation fan 2133d is stopped. When a started fan fails, another fan is started to ensure that the heat dissipation of the element with a high protection level is not affected.

In the foregoing embodiment, the cooling fins of the first heat sink 215, the cooling fins of the second heat sink 215b, and the second heat exchanger 212b may dissipate the heat in the heat dissipation cavity 220 through air ducts in series, air ducts in parallel, or air ducts independent of each other, or may dissipate the heat through a cooling medium. This is not limited in this embodiment.

The heat exchanger provided in this embodiment is used to improve heat dissipation efficiency when heat is dissipated for the element with a high protection level or the magnetic element.

According to the power converter provided in the foregoing embodiments, an embodiment further provides a heat exchanger. The heat exchanger may be configured to dissipate the heat for the magnetic element or dissipate the heat for the element with a high protection level. That is, the first heat exchanger and the second heat exchanger in the foregoing embodiments may use the heat exchanger. The following provides descriptions with reference to the accompanying drawings.

Figure 20:
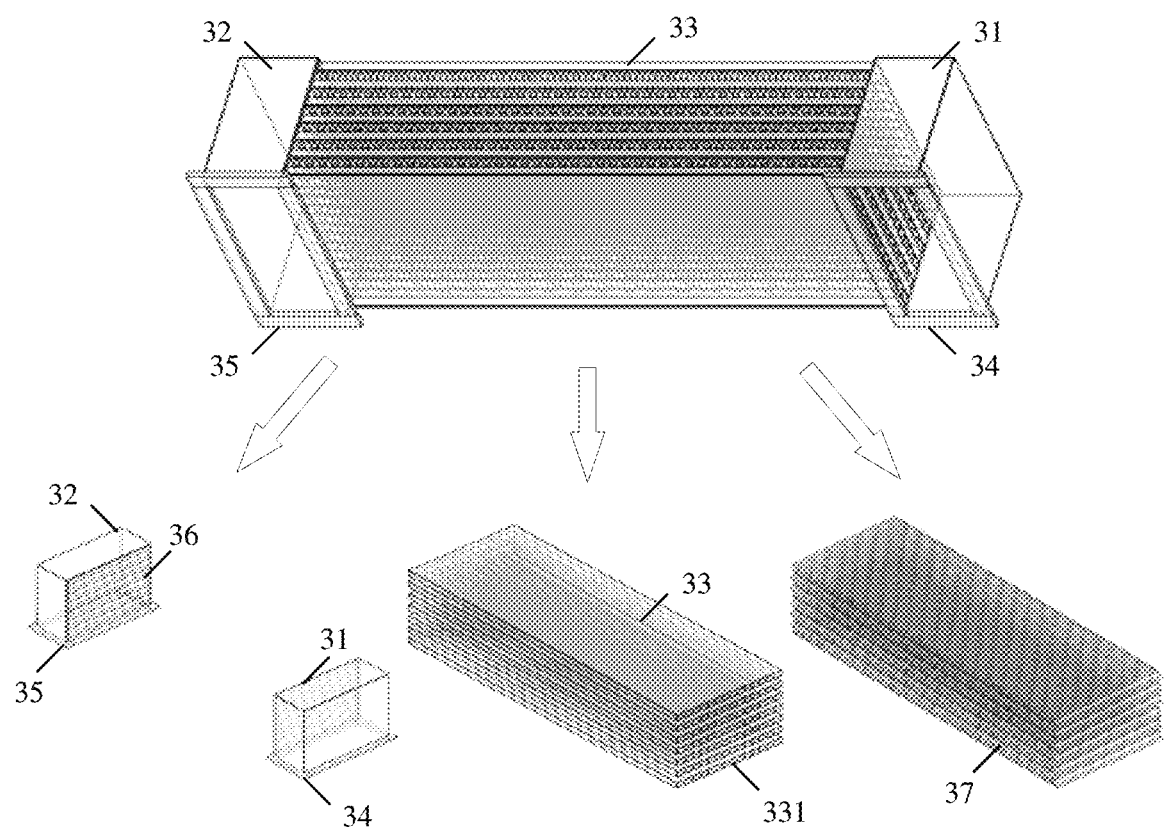
FIG. 20 is a schematic diagram of a heat exchanger according to an embodiment.

FIG. 20 is a schematic diagram of a heat exchanger according to an embodiment.

The heat exchanger includes a first air collection cavity 31, a second air collection cavity 32, and a connection portion 33.

The connection portion 33 includes at least one tubular channel. In actual application, to improve heat dissipation effect, a plurality of tubular channels may be included.

The tubular channel may be formed by extrusion of a profile or may be rolled into a tubular channel by using a plate. This is not limited in this embodiment. In a possible implementation, the tubular channel is a flat cuboid channel.

The connection portion 33 is configured to connect the first air collection cavity 31 and the second air collection cavity 32.

The first air collection cavity 31 is connected to an air supply vent through a first sealing flange 34, and the second air collection cavity 32 is connected to an air return vent through a second sealing flange 35.

A side wall 36 of the air collection cavity is provided with holes that matches a quantity and a size of the tubular channels, and the tubular channels are inserted into the air collection cavity.

A separation rib 331 may be disposed inside the tubular channel to improve heat dissipation effect.

When the connection portion 33 includes a plurality of tubular channels, cooling fins 37 may be embedded between two adjacent tubular channels, to improve heat dissipation effect.

A tubular channel, an air collection cavity, and external fins are integrated by welding.

Figure 21:
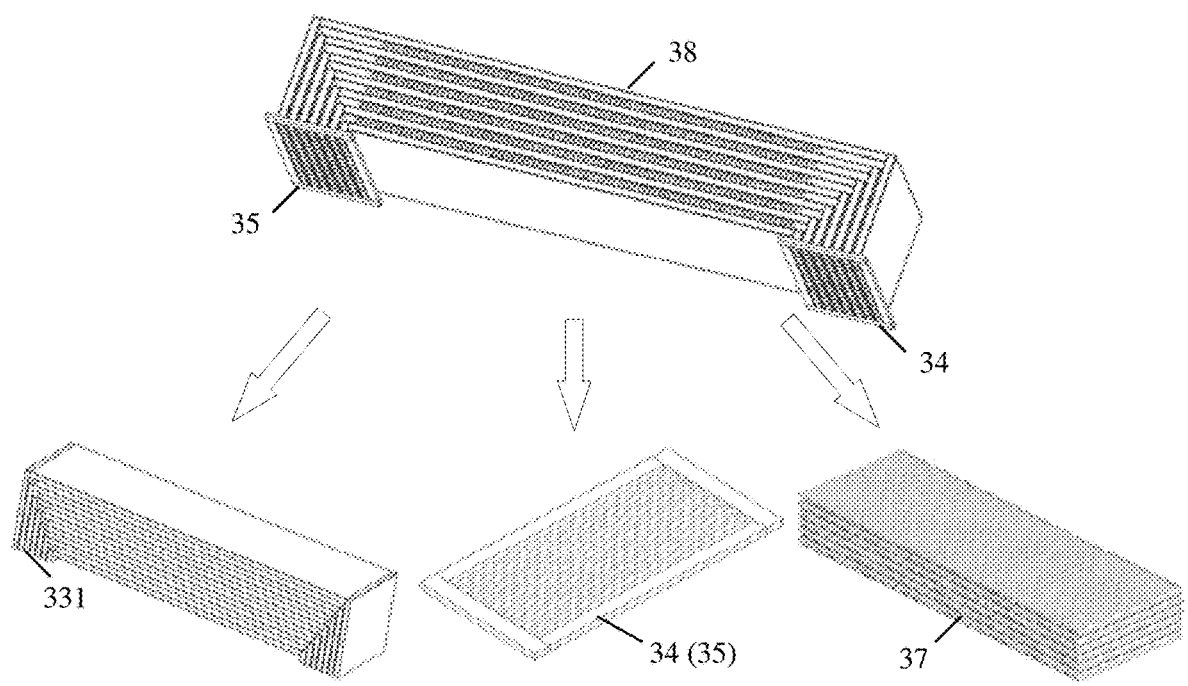
FIG. 21 is a schematic diagram of another heat exchanger according to an embodiment.

FIG. 21 is a schematic diagram of another heat exchanger according to an embodiment.

The heat exchanger shown in the figure includes a first sealing flange 34, a second sealing flange 35, and at least two bent tubular channels 38.

A first end of the at least two bent tubular channels 38 is connected to an air supply vent through the first sealing flange 34, and a second end of the at least two bent tubular channels 38 is connected to an air return vent through the second sealing flange 35.

The bent tubular channel may be formed by extrusion of a profile or may be rolled into a tubular channel by using a plate. This is not limited in this embodiment. In a possible implementation, the bent tubular channel is a flat cuboid channel, and is bent at two ends of the bent tubular channel.

In some embodiments, the first sealing flange 34 and the second sealing flange 35 are provided with holes that match a quantity and a size of the bent tubular channels, and two ends of the bent tubular channels can be inserted into a hole position corresponding to the sealing flange.

A separation rib 331 is disposed inside the bent tubular channel 38 to improve heat dissipation effect.

Cooling fins are embedded between the bent tubular channels 38 to improve heat dissipation effect.

The bent tubular channel, the sealing flange and the external fins are integrated by welding.

The heat exchanger provided in this embodiment is used to improve heat dissipation efficiency when heat is dissipated for the element with a high protection level or the magnetic element.

According to the power converter provided in the foregoing embodiments, an embodiment further provides a heat sink. The following provides descriptions with reference to the accompanying drawings.

Figure 22:
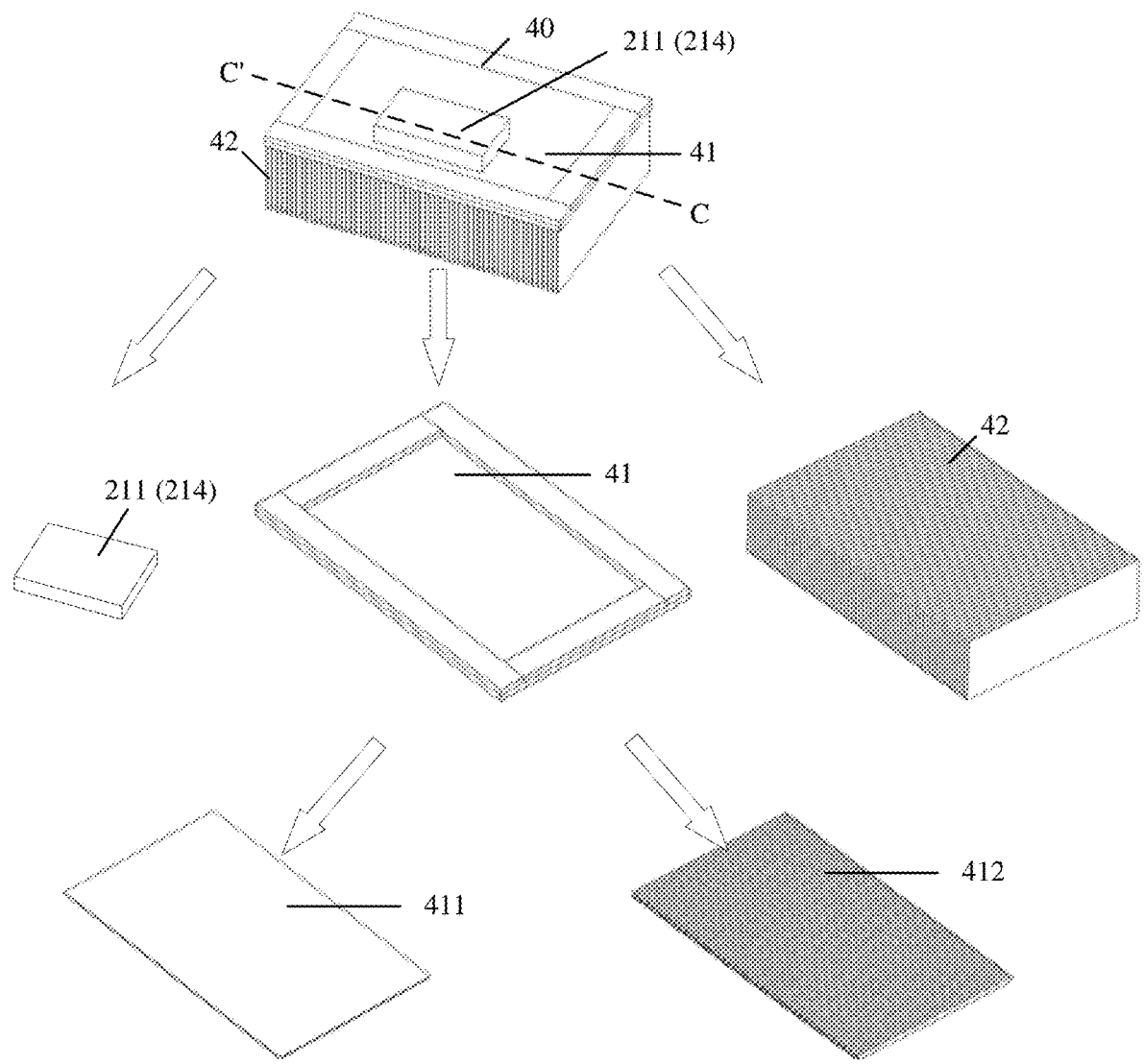
FIG. 22 is a schematic structural diagram of a heat sink according to an embodiment.
Figure 23:
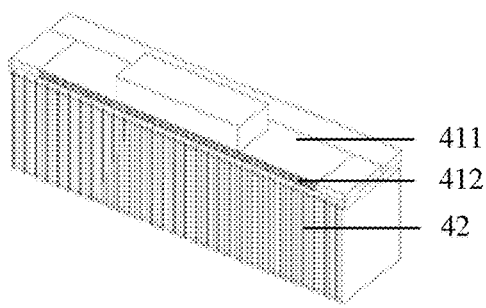
FIG. 23 is a C-C' sectional view of the heat sink in FIG. 22 according to an embodiment.

Reference is made to both FIG. 22 and FIG. 23. FIG. 22 is a schematic structural diagram of a heat sink according to an embodiment. FIG. 23 is a C-C' sectional view of the heat sink in FIG. 22 according to an embodiment.

A heat sink 40 includes a substrate 41 and cooling fins 42.

The cooling fins 42 are configured to perform contact heat dissipation on the substrate 41.

The substrate 41 includes a uniform temperature cavity, and the uniform temperature cavity is filled with a working medium capable of performing gas-liquid phase conversion.

A to-be-dissipated component, that is, devices with high heat consumption density, such as the magnetic element 211 and the power semiconductor device 214, is disposed at a lower-middle position of the substrate.

In some embodiments, inner cooling fins 412 are further disposed in the uniform temperature cavity, to accelerate a uniform temperature of the substrate.

The cooling fins in the uniform temperature cavity, the bottom of the substrate, and a cavity cover 411 on the top of the substrate are integrated by welding. After vacuuming, the working medium is injected into the uniform temperature cavity through a reserved liquid injection opening, and finally the liquid injection opening is closed.

The external cooling fins 42 may be integrally formed in a manner such as extrusion or shovel teeth or may be connected by welding. The working medium at the bottom of the inner cavity is heated, and the gas-liquid phase changes, and condensation and reflow are performed at the top to achieve a uniform temperature of the entire substrate.

The following describes an implementation of another heat sink.

Figure 24:
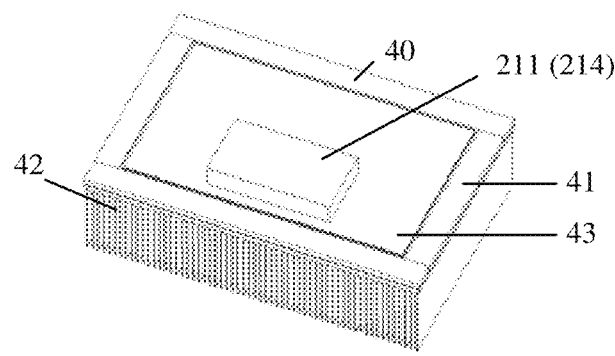
FIG. 24 is a schematic structural diagram of another heat sink according to an embodiment.
Figure 25:
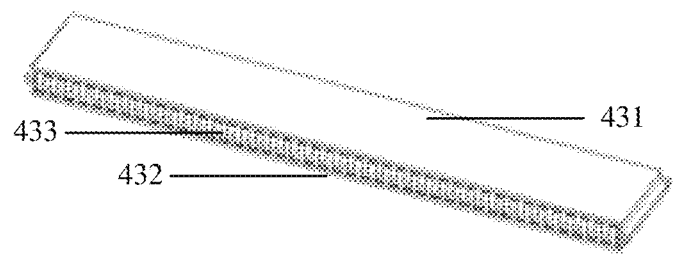
FIG. 25 is a sectional view of a vapor chamber according to an embodiment.

Reference is made to both FIG. 24 and FIG. 25. FIG. 24 is a schematic structural diagram of another heat sink according to an embodiment. FIG. 25 is a sectional view of a vapor chamber according to an embodiment.

A heat sink 40 includes a substrate 41, cooling fins 42, and a vapor chamber 43.

The cooling fins 42 are configured to perform contact heat dissipation on the substrate 41.

In this embodiment, an example in which the vapor chamber 43 is disposed on the substrate 41 is used for description.

An inner cavity of the vapor chamber 43 is filled with a working medium capable of performing gas-liquid phase conversion.

A to-be-dissipated component, that is, devices with high heat consumption density, such as the magnetic element 211 and the power semiconductor device 214, is disposed at a lower-middle position of the vapor chamber 43.

In some embodiments, cooling fins 433 are further disposed in the vapor chamber 43 to increase a uniform temperature speed.

As shown in FIG. 25, the vapor chamber 43 may be installed on the substrate by using a screw or by welding. The vapor chamber 43 includes an upper cover 431 and a lower cover 432.

The upper cover 431, the lower cover 432, and the internal cooling fins 433 are welded together. After vacuuming, the working medium is injected into the vapor chamber 43 through a reserved liquid injection opening, and finally the liquid injection opening is closed. The external cooling fins 42 may be integrally formed in a manner such as extrusion or shovel teeth or may be connected by welding. During operation, the component that is to dissipate heat is installed at a lower-middle position of the vapor chamber 43. The working medium at the bottom of the inner cavity of the vapor chamber 43 is heated, and a gas-liquid phase change occurs. Condensation is performed on the top of the vapor chamber 43 to implement a uniform temperature of the entire substrate.

In some other implementations, the vapor chamber 43 may be mounted to the inner cavity of the substrate 41 by using a screw or by welding. In this case, a to-be-dissipated component is disposed at a lower-middle position of the substrate 41.

The heat sink provided in this embodiment improves a uniform temperature speed of the substrate, thereby improving heat dissipation efficiency of the power semiconductor device, the magnetic element, and another device with high heat consumption density.

According to the power converter provided in the foregoing embodiments, an embodiment further provides a photovoltaic power generation system. The following provides descriptions with reference to the accompanying drawings.

Figure 26:
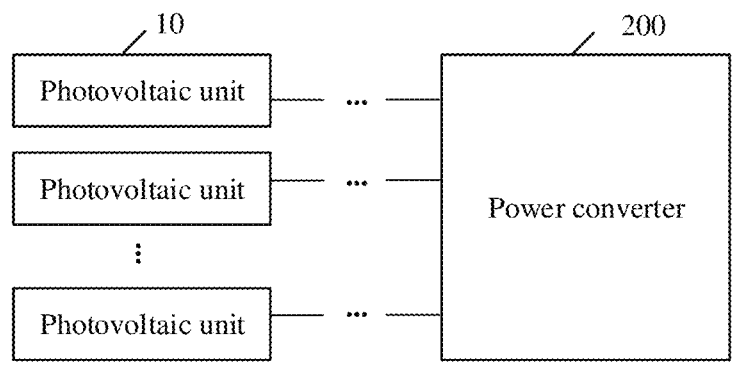
FIG. 26 is a schematic diagram of a photovoltaic power generation system according to an embodiment.

FIG. 26 is a schematic diagram of a photovoltaic power generation system according to an embodiment.

The photovoltaic power generation system 26 includes the power converter 200 provided in the foregoing embodiment, and further includes a photovoltaic unit 10.

A quantity of photovoltaic units is not limited in this embodiment.

The photovoltaic unit 10 includes at least one photovoltaic module. When the photovoltaic unit 10 includes a plurality of photovoltaic modules, the plurality of photovoltaic modules may form a photovoltaic string by connecting a positive electrode and a negative electrode in series, to form the photovoltaic unit 10. Alternatively, the plurality of photovoltaic modules may be first connected in series to form a plurality of photovoltaic strings, and then the plurality of photovoltaic strings may be connected in parallel to form the photovoltaic unit 10.

The photovoltaic unit 10 is configured to convert light energy into a direct current.

For an implementation of the power converter 200, refer to the related description in the foregoing embodiments. Details are not described herein in this embodiment.

In some embodiments, the power converter 200 is a central inverter. In this case, the photovoltaic power generation system includes a direct current combiner box or an MPPT boost combiner box, which is collectively referred to as a combiner box below. The photovoltaic unit first converges a direct current into the combiner box, and then the central inverter inverts a direct current input by at least one combiner box to an alternating current.

In some other embodiments, the power converter 200 is a string inverter. In this case, an input end of the power converter 200 may be directly connected to a photovoltaic unit or connected to a photovoltaic optimizer string.

In some other embodiments, the power converter 200 is an MPPT boost combiner box. In this case, an input end of the power converter 200 may be directly connected to a photovoltaic unit.

The photovoltaic power generation system uses the power converter provided in the embodiments. The power converter disposes the power semiconductor device and the magnetic element in the sealed cavity for heat dissipation, thereby improving reliability of the power converter. For a power semiconductor device with high heat consumption density, the heat sink is used for heat dissipation, thereby improving heat dissipation efficiency. For the magnetic element, the heat sink or the heat exchanger may be used for heat dissipation. The cooling fins of the used heat sink or the heat exchanger are disposed in the heat dissipation cavity, and the heat dissipation cavity and the sealed cavity are disposed separately. This ensures high protection levels and implements efficient heat dissipation.

It should be understood that, "at least one (item)" refers to one or more and "a plurality of" refers to two or more. The term "and/or" is used for describing an association relationship between associated objects and represents that three relationships may exist. For example, "A and/or B" may represent the following three cases: only A exists, only B exists, and both A and B exist, where A and B may be singular or plural. A character "/" may indicate an "or" relationship between the associated objects. "At least one of the following items (pieces)" or a similar expression thereof refers to any combination of these items, including any combination of singular items (pieces) or plural items (pieces). For example, at least one of a, b, or c may indicate a, b, c, a and b, a and c, b and c, or a, b, and c, where a, b, and c may be singular or plural.

The foregoing embodiments are merely intended for describing the embodiments rather than limiting. Although described in detail with reference to the foregoing embodiments, persons of ordinary skill in the art should understand that they may still make modifications without departing from the spirit and scope of the embodiments.

The invention claimed is:

1. A power converter comprising:
a power semiconductor device and a magnetic element are disposed in a sealed cavity;
wherein the power semiconductor device is configured to dissipate heat through a first heat sink, and cooling fins of the first heat sink are located in a heat dissipation cavity; and
wherein the magnetic element is configured to dissipate the heat through a heat exchanger located in the heat dissipation cavity, the sealed cavity comprises a first air duct, and the magnetic element is disposed in the first air duct;
a first end of the first air duct is an air supply vent, a second end of the first air duct is an air return vent, the air supply vent is connected to a first end of the heat exchanger, and the air return vent is connected to a second end of the heat exchanger; and
at least one first internal circulation fan is further disposed at the air supply vent or the air return vent, and is configured to control an air flow to start from the air supply vent and arrive at the air return vent along an inner cavity of the first air duct.

2. The power converter according to claim 1, wherein the sealed cavity further comprises a second air duct, a first end of the second air duct is shared with the first end of the first air duct, and a second end of the second air duct is connected to the inner cavity of the first air duct and an inner cavity of the sealed cavity; and
at least one second internal circulation fan is further disposed in the second air duct, and is configured to control an air flow to start from the second air duct and arrive at the air return vent along the inner cavity of the first air duct.

3. The power converter according to claim 1, wherein at least one second internal circulation fan is further disposed in the sealed cavity;

a cavity wall of the first air duct comprises a plurality of groups of rebound structures, and each group of rebound structures comprises an air duct plate and a cavity wall hole;

a force direction of the air duct plate when the air duct plate rebounds points to the inside of the first air duct, an area of the air duct plate is greater than an area of the cavity wall hole, and the air duct plate is configured to cover the entire cavity wall hole; and the at least one second internal circulation fan is configured to:

when the air duct plate rebounds, control an air flow to arrive at the air return vent after passing through an inner cavity of the sealed cavity and the inner cavity of the first air duct.

4. The power converter according to claim 3, wherein each group of the rebound structures further comprises:

a stop structure configured to limit a rebound position of the air duct plate when the air duct plate rebounds.

5. The power converter according to claim 1, wherein the cooling fins of the first heat sink and the heat exchanger are configured to dissipate the heat in the heat dissipation cavity through an air duct, air ducts in series, air ducts in parallel, or air ducts independent of each other.

6. The power converter according to claim 1, wherein the heat exchanger comprises a first air collection cavity, a second air collection cavity, and a connection portion;

the connection portion comprises at least one tubular channel;

the at least one tubular channel is configured to connect the first air collection cavity and the second air collection cavity;

the first air collection cavity is connected to the air supply vent through a first sealing flange, and the second air collection cavity is connected to the air return vent through a second sealing flange; and a separation rib is disposed inside the at least one tubular channel.

7. The power converter according to claim 6, wherein the connection portion comprises at least two tubular channels, and cooling fins are embedded between the at least two tubular channels.

8. The power converter according to claim 1, wherein the heat exchanger comprises a first sealing flange, a second sealing flange, and at least two bent tubular channels;

a first end of the at least two bent tubular channels is connected to the air supply vent through the first sealing flange, and a second end of the at least two bent tubular channels is connected to the air return vent through the second sealing flange; and a separation rib is disposed inside the at least two bent tubular channels.

9. The power converter according to claim 8, wherein cooling fins are embedded between the at least two bent tubular channels.

10. The power converter according to claim 1, wherein the magnetic element is configured to dissipate the heat through the first heat sink, and the power converter further comprises an element with a high protection level;

the element with a high protection level is disposed in the sealed cavity.

11. The power converter according to claim 10, wherein the at least one first circulation fan is a plurality of circulation fans provided at both the air supply vent and the air return vent, and wherein the plurality of circulation fans are configured to control an air flow to start from the air supply vent and arrive at the air return vent along the inner cavity of the sealed cavity.

12. The power converter according to claim 11, wherein the cooling fins of the first heat sink and the heat exchanger are configured to dissipate the heat in the heat dissipation cavity through air ducts in series, air ducts in parallel, or air ducts independent of each other.

13. The power converter according to claim 1, wherein the first heat sink comprises a substrate and the cooling fins;

the cooling fins are configured to perform contact heat dissipation on the substrate;

the substrate comprises a uniform temperature cavity, and the uniform temperature cavity is filled with a working substance configured to perform gas-liquid phase conversion; and a to-be-cooled component is disposed at a lower-middle position of the substrate.

14. The power converter according to claim 13, wherein cooling fins are further disposed in the uniform temperature cavity.

15. The power converter according to claim 1, wherein the first heat sink comprises a substrate, a vapor chamber, and the cooling fins;

the cooling fins are configured to perform contact heat dissipation on the substrate;

an inner cavity of the vapor chamber is filled with a working substance configured to perform gas-liquid phase conversion; and the vapor chamber is fixedly disposed on the substrate, and a to-be-cooled component is disposed at a lower-middle position of the vapor chamber, or the vapor chamber is fixedly disposed in an inner cavity of the substrate, and the to-be-cooled component is disposed at a lower-middle position of the substrate.

16. The power converter according to claim 15, wherein cooling fins are further disposed in the vapor chamber.

17. The power converter according to claim 1, wherein the power converter is a central inverter, a string inverter, or a maximum power point tracking (MPPT) boost combiner box.

* * * * *